(12) United States Patent  
Agarwal

(10) Patent No.: US 7,491,602 B2
(45) Date of Patent: Feb. 17, 2009

(54) STRUCTURES AND METHODS FOR IMPROVED CAPACITOR CELLS IN INTEGRATED CIRCUITS

(75) Inventor: Vishnu K. Agarwal, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 10/615,891

(22) Filed: Jul. 8, 2003

(65) Prior Publication Data

US 2004/0094787 A1    May 20, 2004

Related U.S. Application Data

(62) Division of application No. 09/499,726, filed on Feb. 8, 2000, now Pat. No. 6,590,246.

(51) Int. Cl.
*H01L 29/72* (2006.01)
(52) U.S. Cl. .................. 438/239; 438/396; 438/586; 257/306
(58) Field of Classification Search .......... 257/306, 257/307, 308, 312; 438/396, 240, 250, 253, 438/785, 586, 239
See application file for complete search history.

(56) References Cited

U.S. PATENT DOCUMENTS

| 5,032,545 A | 7/1991 | Doan et al. .............. 437/242 |
| 5,068,199 A | 11/1991 | Sandhu .................... 437/52 |
| 5,142,438 A | 8/1992 | Reinberg et al. ........... 361/313 |
| 5,335,138 A * | 8/1994 | Sandhu et al. ............ 257/68 |
| 5,440,173 A | 8/1995 | Evans, Jr. et al. .......... 257/751 |
| 5,573,979 A | 11/1996 | Tsu et al. .................. 437/195 |
| 5,604,145 A | 2/1997 | Hashizume et al. .......... 437/52 |
| 5,844,771 A | 12/1998 | Graettinger et al. ......... 361/303 |
| 5,963,814 A | 10/1999 | Walker et al. .............. 438/387 |
| 5,969,983 A | 10/1999 | Thakur et al. .............. 365/149 |
| 5,972,771 A | 10/1999 | Figura ....................... 438/398 |
| 6,011,284 A | 1/2000 | Katori et al. ................ 257/295 |
| 6,171,941 B1 * | 1/2001 | Park et al. .................. 438/586 |
| 6,207,522 B1 | 3/2001 | Hwang et al. ............... 438/660 |
| 6,207,561 B1 | 3/2001 | Hwang et al. ............... 438/660 |
| 6,432,793 B1 * | 8/2002 | Reinberg .................... 438/396 |

FOREIGN PATENT DOCUMENTS

EP    0697719    2/1996

* cited by examiner

*Primary Examiner*—Edward Wojciechowicz
(74) *Attorney, Agent, or Firm*—Schwegman, Lundberg & Woessner, P.A.

(57) ABSTRACT

Systems, devices, structures, and methods are described that inhibit atomic migration that creates an open contact between a metallization layer and a conductive layer of a semiconductor structure. A layer of an inhibiting substance may be used to inhibit a net flow of atoms so as to maintain conductivity between the metallization layer and the conductive layer of the semiconductor structure. Such layer of inhibiting substance acts even with the presence of point defects for a given temperature.

22 Claims, 22 Drawing Sheets

STRUCTURES AND METHODS FOR IMPROVED CAPACITOR CELLS IN INTEGRATED CIRCUITS

RELATED APPLICATIONS

This application is a Divisional of U.S. Ser. No. 09/499,726, filed on Feb. 8, 2000, now U.S. Pat. No. 6,590,246, the specification of which is incorporated herein by reference.

This application is related to the following co-pending and commonly assigned application: U.S. Ser. No. 09/364852 filed Jul. 30, 1999, now issued as U.S. Pat. No. 6,465,828 on Oct. 15, 2002, entitled Semiconductor Container Structure with Diffusion Barrier, which is hereby incorporated by reference.

TECHNICAL FIELD

The technical field relates generally to semiconductor integrated circuits. More particularly, it pertains to capacitors in semiconductor integrated circuits.

BACKGROUND

A capacitor is composed of two layers of a material that is electrically conductive (hereinafter, electrode) brought near to one another and separated by a material that is electrically nonconductive. Suppose the capacitor is connected to a battery with a certain voltage level (hereinafter, energy level). Charges will flow from the battery to be stored in the capacitor until the capacitor exhibits the energy level of the battery. Then, suppose further that the capacitor is disconnected from the battery. The capacitor will indefinitely exhibit the energy level of the battery until the charges stored in the capacitor are removed either by design or by accident.

This ability of the capacitor to "remember" an energy level is valuable to the operation of semiconductor integrated circuits. Often, the operation of such circuits may require that data be stored and retrieved as desired. Because of its ability to remember, the capacitor is a major component of a semiconductor memory cell. One memory cell may store one bit of data. A system of memory cells is a semiconductor memory array where information can be randomly stored or retrieved from each memory cell. Such a system is also known as a random-access memory.

One type of random-access memory is dynamic random-access memory (DRAM). The charges stored in DRAM tend to leak away over a short time. It is thus necessary to periodically refresh the charges stored in the DRAM by the use of additional circuitry. Even with the refresh burden, DRAM is a popular type of memory because it can occupy a very small space on a semiconductor surface. This is desirable because of the need to maximize storage capacity on the limited surface area of an integrated circuit.

One type of capacitor that supports an increase in storage capacity uses an electrode composed of a metal compound. So that charges can be transferred into and out of the capacitor, a metallization layer is placed in connection with the metal compound electrode of the capacitor. The metallization layer may act with the metal compound to create a region that is electrically nonconductive. That act compromises the ability of charges to move into and out of the capacitor at the junction of the electrode. This effect is detrimental to the storage ability of a capacitor and would render a memory cell defective. One solution that has been proposed is to use polysilicon as a layer in contact with the capacitor. However, this solution is inadequate in that the polysilicon may act at a certain temperature with the metal compound electrode of the capacitor to form an electrically nonconductive region.

Thus, what is needed are systems, devices, structures, and methods to inhibit the described effect so as to maintain electrical contact between the metallization layer and the capacitor.

SUMMARY

The above-mentioned problems with capacitors as well as other problems are addressed by the present invention and will be understood by reading and studying the following specification. Systems, devices, structures, and methods are described which accord these benefits.

An illustrative embodiment includes a capacitor. The capacitor comprises a first electrode, a first dielectric coupled to the first electrode, and a second electrode coupled to the first dielectric. The second electrode includes an inhibiting layer so as to inhibit formation of an undesired second dielectric.

Another illustrative embodiment includes a capacitor. The capacitor comprises a first electrode that comprises at least one conductive metal oxide. The conductive metal oxide is selected from a group consisting of ruthenium oxide and iridium oxide. The capacitor includes a dielectric coupled to the first electrode. The dielectric comprises at least one insulator metal oxide. The metal oxide includes ditantalum pentaoxide. The capacitor includes a second electrode. The second electrode comprises the conductive metal oxide that is selected from a group consisting of ruthenium oxide and iridum oxide. The second electrode also comprises an inhibiting layer. The inhibiting layer comprises a substance selected from a group consisting of a transition metal, a transition metal alloy, a nitride compound, a noble metal, and a noble metal alloy. The transition metal is selected from a group consisting of platinum, rhodium, and tungsten. The transition metal alloy includes a platinum rhodium alloy. The nitride compound is selected from a group consisting of tungsten nitride and titanium nitride. The noble metal includes platinum, gold, titanium, and silver. The noble metal alloy includes graphite, chlorimet 3, and hastelloy C.

Another illustrative embodiment includes a semiconductor structure. The semiconductor structure includes an insulation layer and a first conductive layer abutting the insulation layer. The first conductive layer includes an inhibiting layer that inhibits a diffusion that increases resistivity.

Another illustrative embodiment includes a semiconductor structure. The semiconductor structure includes an insulation layer and a first conductive layer abutting the insulation layer. The first conductive layer includes an inhibiting layer that inhibits formation of an undesired oxidation compound so as to enhance an ohmic contact.

Another illustrative embodiment includes a method of forming a semiconductor structure. The method comprises forming a first conductive layer, forming an insulation layer abutting the first conductive layer, forming a second conductive layer abutting the insulation layer, and forming an inhibiting layer abutting the second conductive layer. The inhibiting layer inhibits formation of an undesired oxidation compound so as to enhance an ohmic contact.

These and other embodiments, aspects, advantages, and features of the present invention will be set forth in part in the description which follows, and in part will become apparent to those skilled in the art by reference to the following description of the invention and referenced drawings or by practice of the invention. The aspects, advantages, and features of the invention are realized and attained by means of the

DETAILED DESCRIPTION

Figure 1:
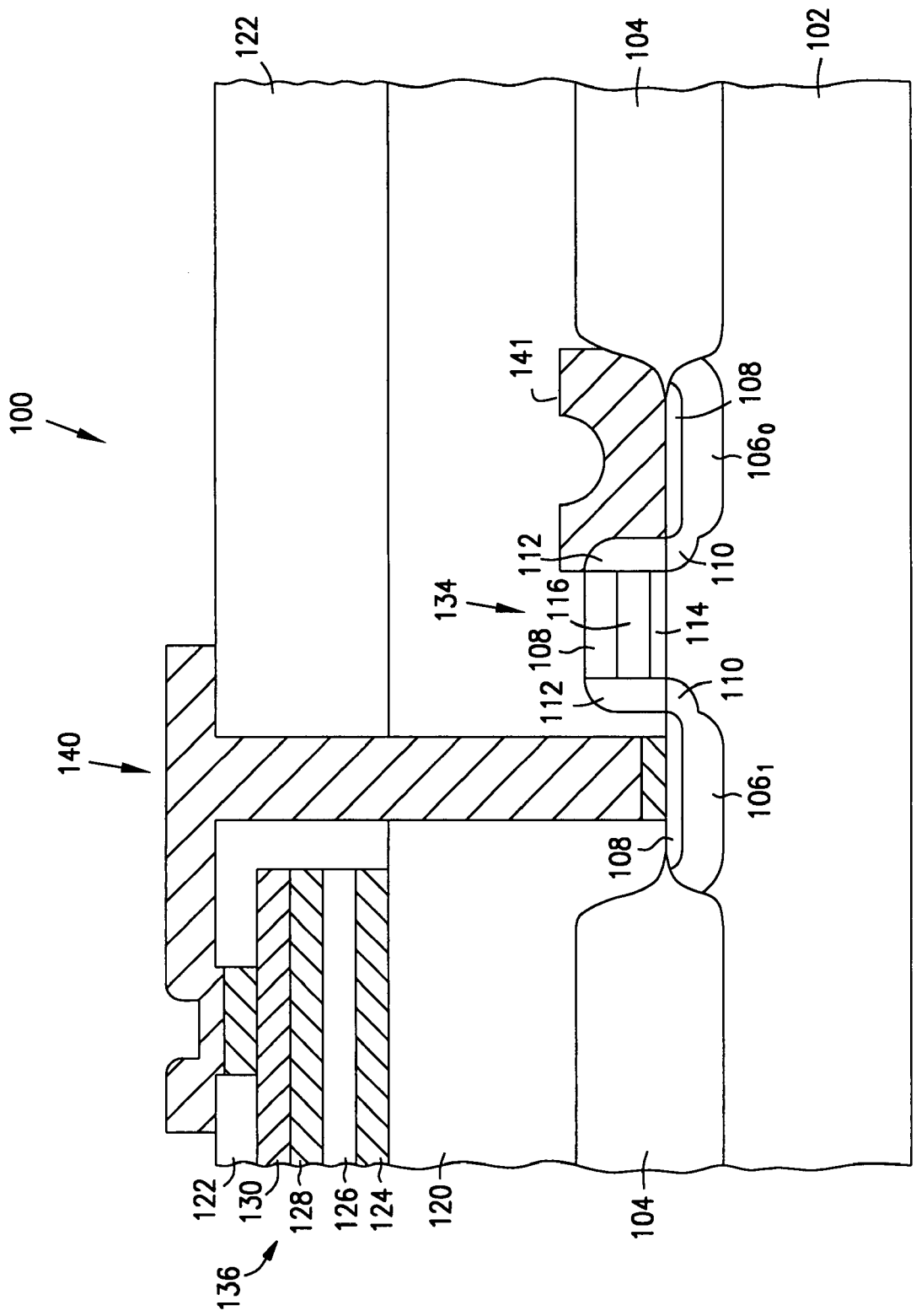
FIG. 1 is a cross-sectional view of a semiconductor structure according to one embodiment of the present invention.

In the following detailed description of the invention, reference is made to the accompanying drawings which form a part hereof, and in which is shown, by way of illustration, specific embodiments in which the invention may be practiced. In the drawings, like numerals describe substantially similar components throughout the several views. These embodiments are described in sufficient detail to enable those skilled in the art to practice the invention. Other embodiments may be utilized and structural, logical, and electrical changes may be made without departing from the scope of the present invention.

The terms wafer and substrate used in the following description include any base semiconductor structure. Both are to be understood as including silicon-on-sapphire (SOS) technology, silicon-on-insulator (SOI) technology, thin film transistor (TFT) technology, doped and undoped semiconductors, epitaxial layers of silicon supported by a base semiconductor structure, as well as other semiconductor structures well known to one skilled in the art. Furthermore, when reference is made to a wafer or substrate in the following description, previous process steps may have been utilized to form regions/junctions in the base semiconductor structure and layer formed above, and the terms wafer or substrate include the underlying layers containing such regions/junctions and layer that may have been formed above. The following detailed description is, therefore, not to be taken in a limiting sense, and the scope of the present invention is defined only by the appended claims.

FIG. 1 is a cross-sectional view of a semiconductor structure according to one embodiment of the present invention. The semiconductor structure 100 may illustrate an example of a single DRAM cell. The semiconductor structure 100 includes a substrate 102, field isolators 104, transistor 134, insulation layers 120 and 122, another semiconductor structure such as a capacitor 136, and a metallization layer 140.

The transistor 134 includes source/drain regions $106_0$ and $106_1$, silicide region 108, spacers 112, gate oxide 114, and gate 116. The source/drain regions $106_0$ and $106_1$ include lightly doped source/drain regions 110. The capacitor 136 includes an electrode 124, a dielectric layer 126, another electrode 128, and an inhibiting layer 130. The dielectric layer 126 is coupled to the electrodes 124 and 128. The term "metallization layer" means the inclusion of a layer where various regions of each circuit element are in contact and proper interconnection of the circuit element is made. The term "metallization layer" means the inclusion of a diffusion barrier or refractory silicides. The term "metallization layer" means the inclusion of wiring to interconnect various devices in an integrated circuit.

Charges can be transferred into or removed from the capacitor 136 by turning on the transistor 134. The transistor 134 is turned on by an appropriate voltage level and polarity placed at the gate 116 so that a depletion region and conducting channel are formed between the source/drain regions $106_0$ and $106_1$. If charges are to be transferred into the capacitor 136, these charges are introduced at the source/drain region $106_0$ by a buried bit line 141, so that they may travel across the conducting channel into the source/drain region $106_1$, conduct through the metallization layer 140, conduct through the inhibiting layer 130, and enter the electrode 128. The charges cannot go any further because the dielectric layer 126 is electrically nonconductive. However, these charges will attract opposite polarity charges to appear at electrode 124. Hence, an electric field is set up between the electrodes 128 and 124. Energy is stored in this electric field. This electric field is the phenomenon that allows the capacitor to "remember."

There exists an industry-wide drive to smaller memory cells to increase storage density on the limited surface area of an integrated circuit. This has motivated the use of a metal oxide conductive material for use as an electrode of the capacitor 136. Without the inhibiting layer 130, this metal oxide conductive material may undesirably act with the metallization layer 140 when the temperature reaches about 400 degrees Celsius or greater. Such act may form an undesired oxide compound that prevents charges from being able to enter or exit the capacitor 136. Thus, because of the undesired oxide compound, an opened contact exists between the metallization layer 140 and the capacitor 136.

The physics of solids may explain this problem. Diffusion is a process that includes materials intermixing on the molecular scale. Although diffusion is readily seen in the mixing of two different liquids, such as ink and water, diffusion also occurs in solids, albeit slowly. One reason why diffusion through solids is slow is because of the tight crystal structures of solids. In such tight crystal structure, molecules that diffuse through a solid would require such a large amount of energy so as to render diffusion nearly impossible. However, at sufficiently high temperature, defects are introduced into the crystal structure such that vacancy in the structure may arise. This vacancy allows diffusion to occur more easily in solids.

Returning to FIG. 1, at temperature of about 400 degrees Celsius, a portion of the metallization layer 140 may have structural defects, such as vacancy. Vacancy allows the oxygen ions in the metal oxide conductive material of the electrode 128 to diffuse through to the metallization layer 140 to form an insulator oxide compound. In the case where the metallization layer 140 includes a layer of titanium, such diffusion may form a titanium oxide compound, which is an insulator. Such a compound compromises the electrical contact between the metallization layer 140 and the capacitor 136.

Figure 1A:
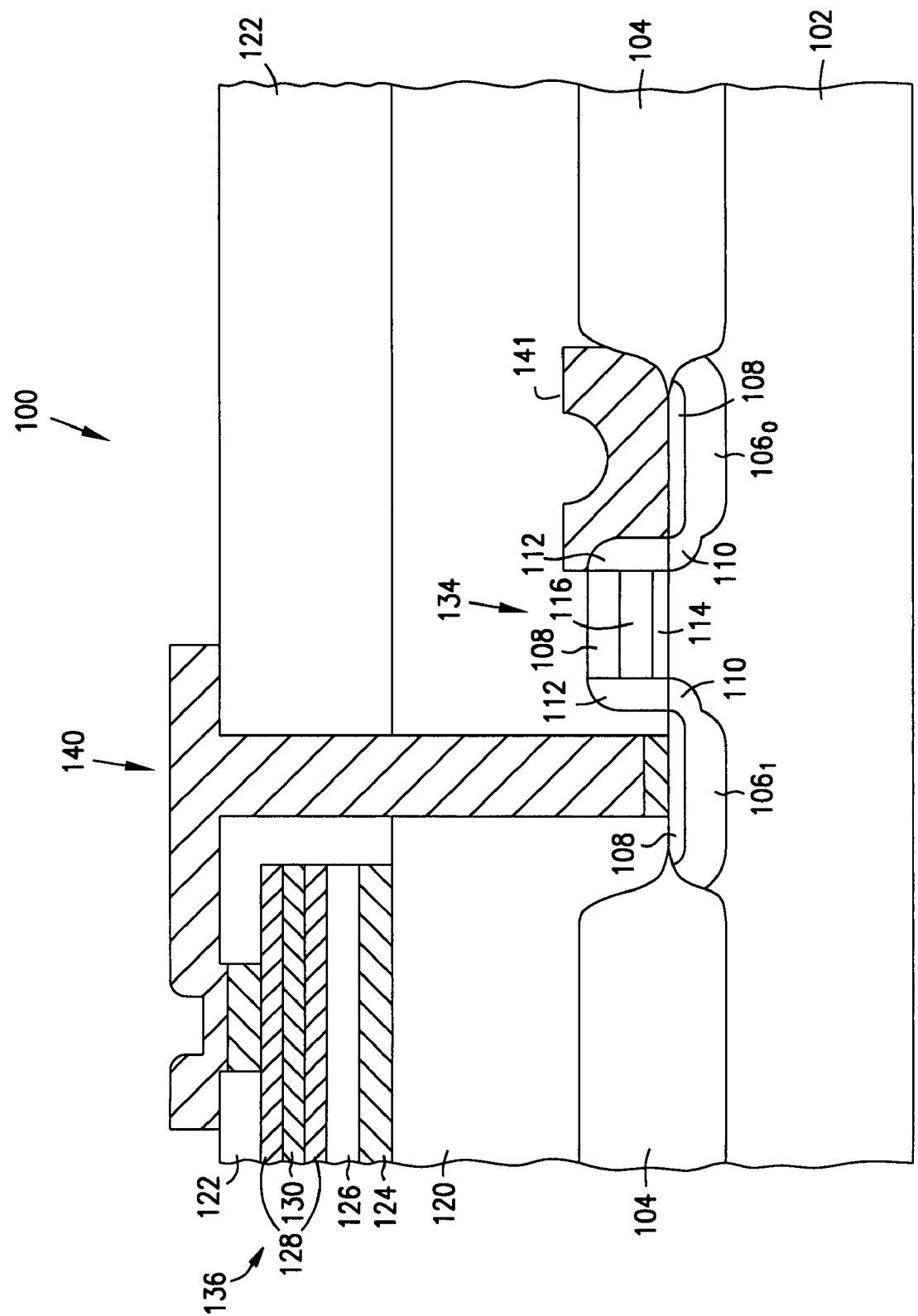
FIG. 1A is a cross-sectional view of a semiconductor structure according to another embodiment of the present invention.

The inhibiting layer 130 acts to inhibit such compromise from occurring. In one embodiment, the inhibiting layer 130 acts to enhance the conductivity between the metallization layer 140 and the capacitor 136. In another embodiment, the inhibiting layer 130 acts to inhibit formation of an undesired dielectric between the metallization layer 140 and the electrode 128. In another embodiment, the inhibiting layer 130 acts to inhibit a diffusion that increases resistivity between the metallization layer 140 and the electrode 128. In another embodiment, the inhibiting layer 130 acts to inhibit formation of an undesired oxidation compound so as to enhance an ohmic contact between the metallization layer 140 and the electrode 128. The term "ohmic contact" means the inclusion of a metal-metal contact, metal-semiconductor contact, or semiconductor-semiconductor contact that has an approximately linear current-voltage characteristic. In another embodiment, the inhibiting layer 130 includes a layer that is disposed on the electrode 128. In another embodiment, the inhibiting layer 130 includes a layer that is embedded in the electrode 128(as shown in FIG. 1A). In one embodiment, the inhibiting layer comprises a substance selected from a group consisting of a transition metal, a transition metal alloy, a nitride compound, a noble metal, and a noble metal alloy. In one embodiment, the transition metal is selected from a group consisting of platinum, rhodium, and tungsten. In another embodiment, the transition metal alloy includes a platinum rhodium alloy. In another embodiment, the nitride compound is selected from a group consisting of tungsten nitride and titanium nitride. In a further embodiment, the noble metal includes platinum, gold, titanium, and silver. In yet another embodiment, the noble metal alloy includes graphite, chlorimet 3, and hastelloy C. Although the aforementioned embodiments focus on the electrode 128, electrode 124 may be used instead if the metallization layer 140 is adapted to contact the electrode 124.

In one embodiment, the electrode 128 comprises at least one conductive metal oxide. In another embodiment, the conductive metal oxide of the electrode 128 is selected from a group consisting of ruthenium oxide and iridium oxide. In another embodiment, the dielectric 126 comprises at least one insulator metal oxide. In another embodiment, the insulator metal oxide includes ditantalum pentaoxide. In another embodiment, the electrode 124 comprises at least one conductive metal oxide. In yet another embodiment, the conductive metal oxide of the electrode 128 is selected from a group consisting of ruthenium oxide and iridium oxide. In a further embodiment, the capacitor 136 comprises a combination of the aforementioned embodiments.

Figure 2:
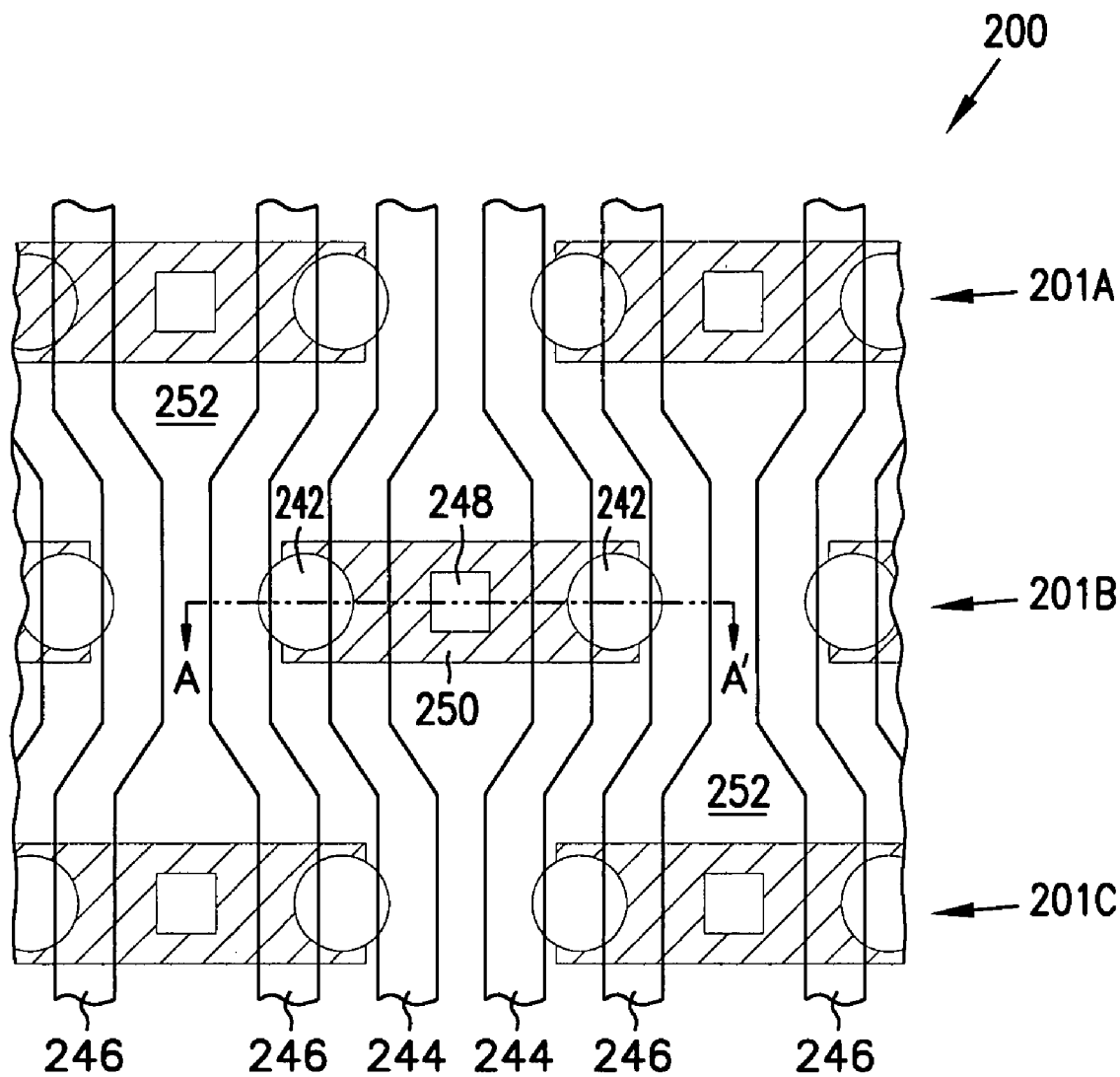
FIG. 2 is an elevation view of a semiconductor memory array according to one embodiment of the present invention.

FIG. 2 is an elevation view of a semiconductor memory array according to one embodiment of the present invention. The memory array 200 includes memory cell regions 242 formed overlying active areas 250. Active areas 250 are separated by field isolation regions 252. Active areas 250 and field isolation regions 252 are formed overlying a semiconductor substrate.

The memory cell regions 242 are arrayed substantially in rows and columns. Shown in FIG. 2 are portions of three rows 201A, 201B and 201C. Separate digit lines (not shown) would be formed overlying each row 201 and coupled to active areas 250 through digit line contact regions 248. Word line regions 244 and 246 are further coupled to active areas 250, with word line regions 244 coupled to active areas 250 in row 201B and word line regions 246 coupled to active areas 250 in rows 201A and 201C. The word line regions 244 and 246, coupled to memory cells in this alternating fashion, generally define the columns of the memory array. This folded bit-line architecture is well known in the art for permitting higher densification of memory cell regions 242.

Figure 3A:
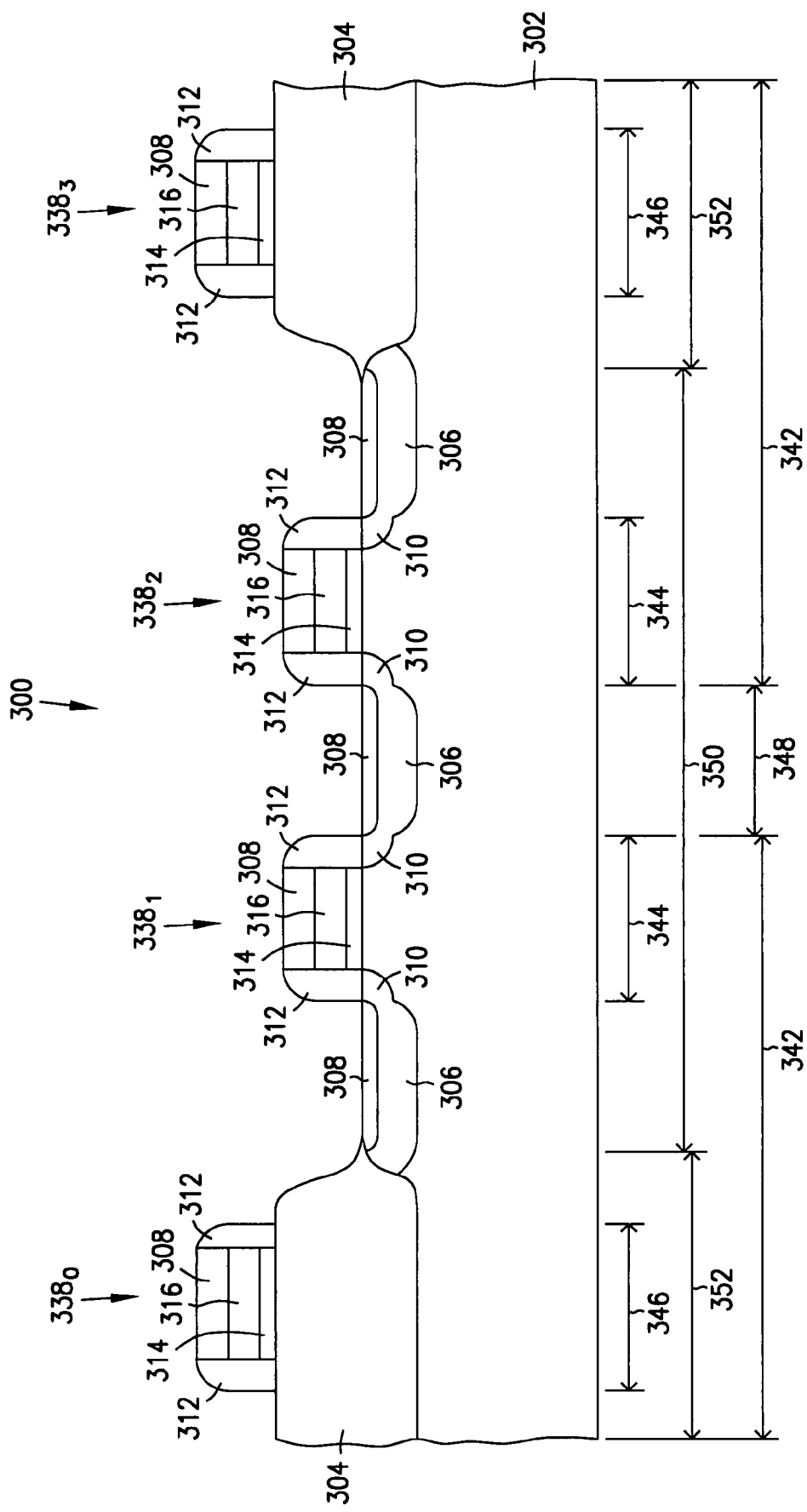
FIGS. 3A-3O are cross-sectional views of a semiconductor structure during processing according to one embodiment of the present invention.
Figure 3B:
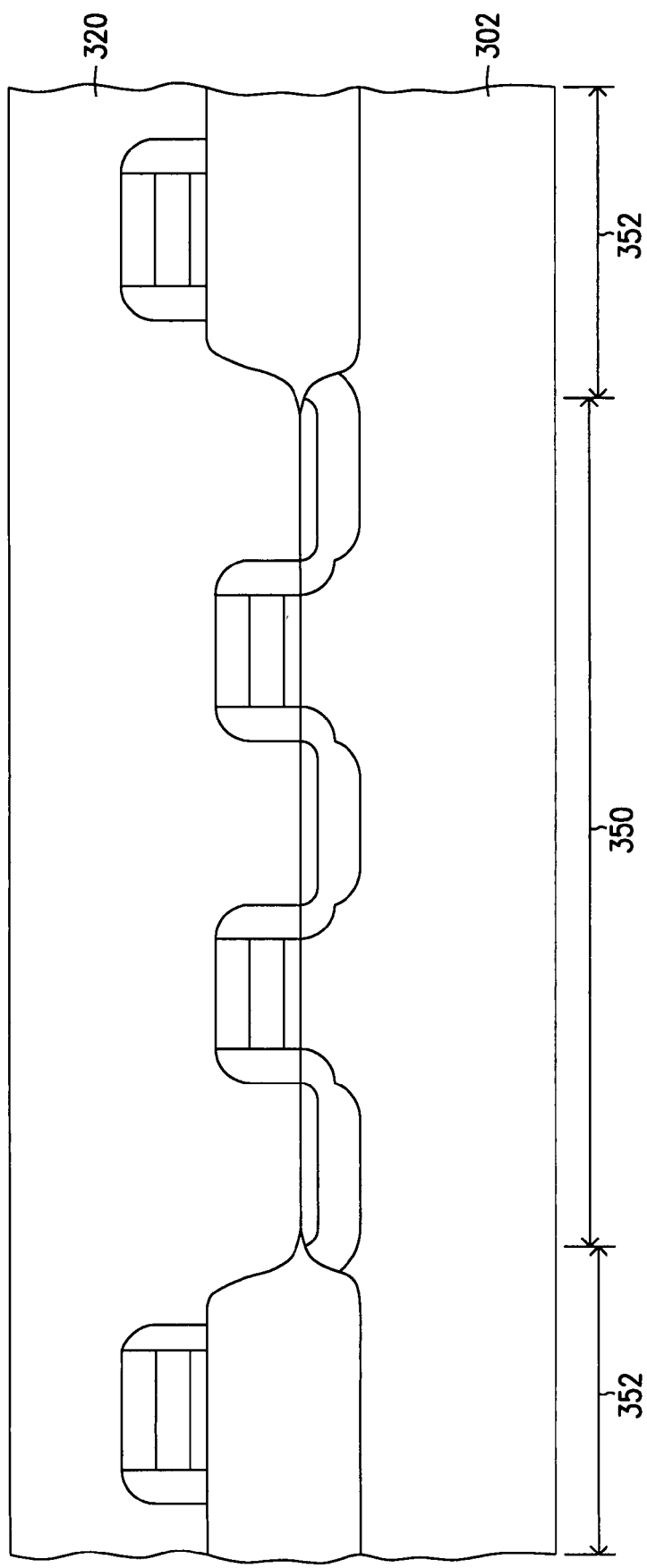
Figure 3C:
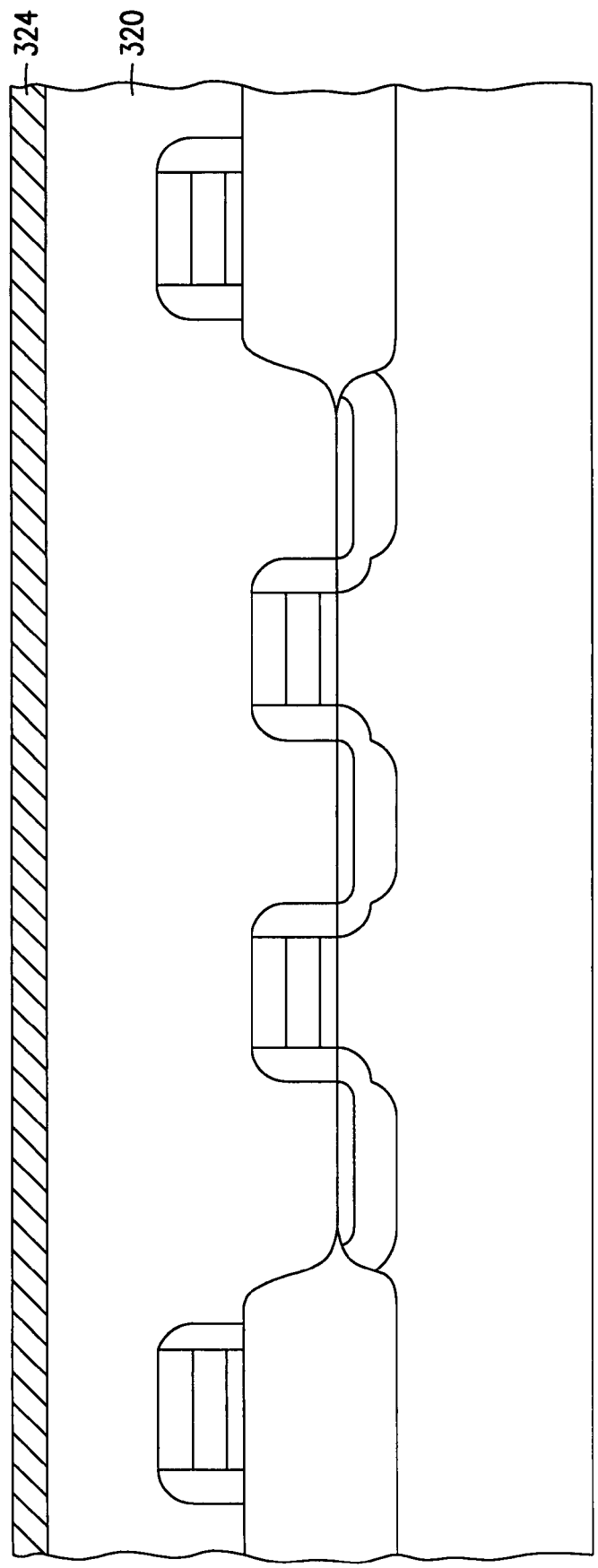
Figure 3D:
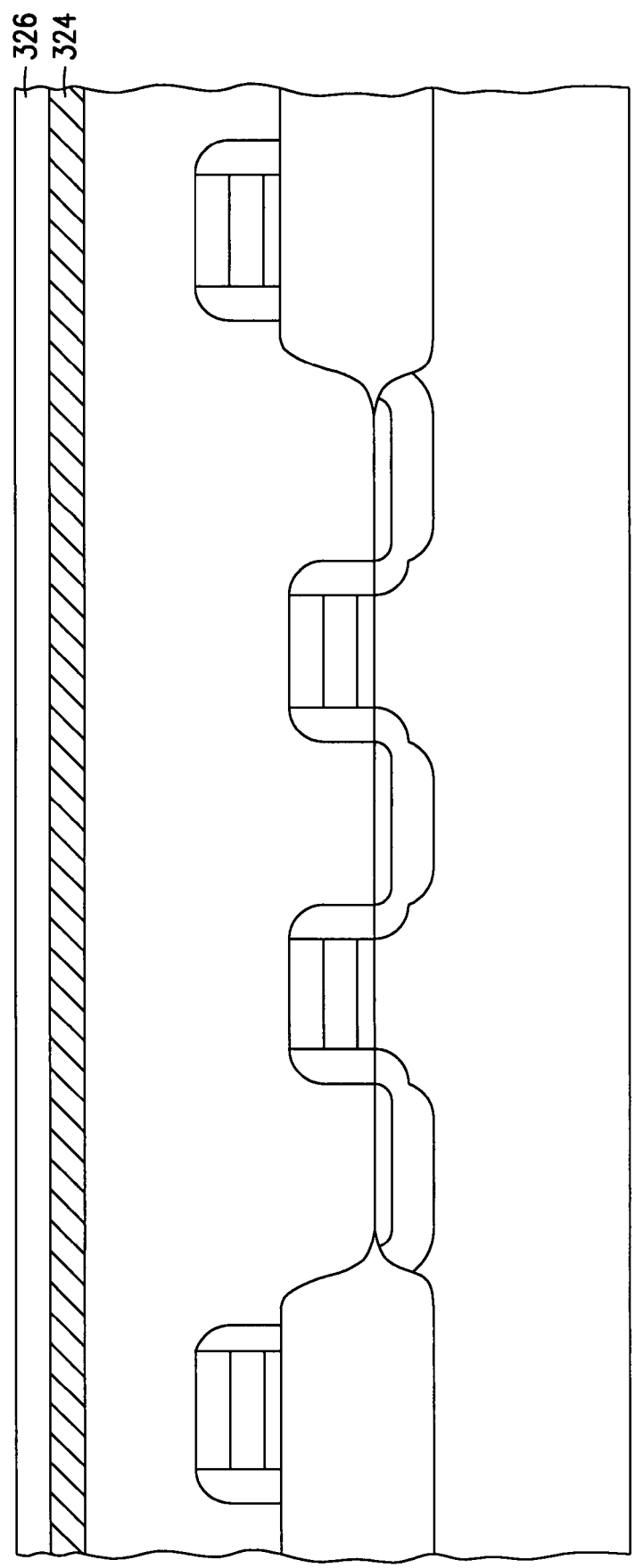
Figure 3E:
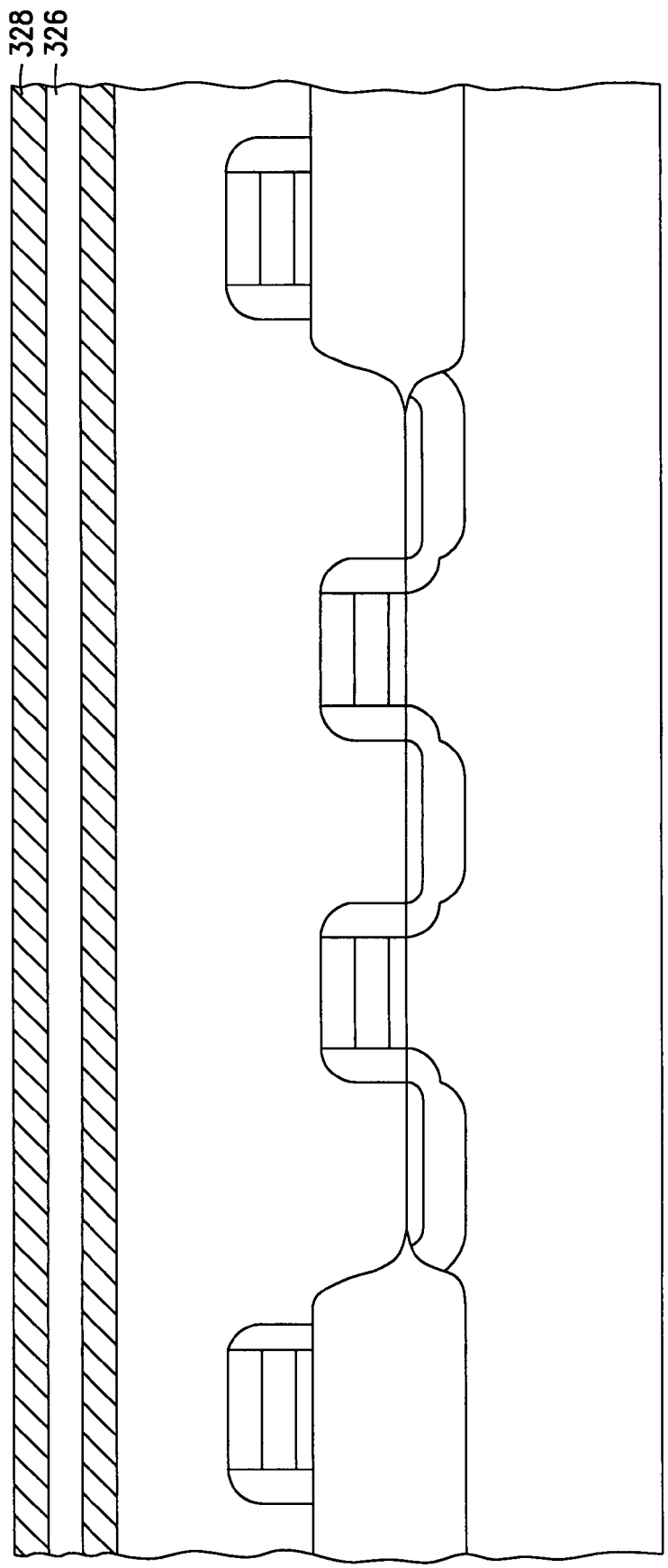
Figure 3F:
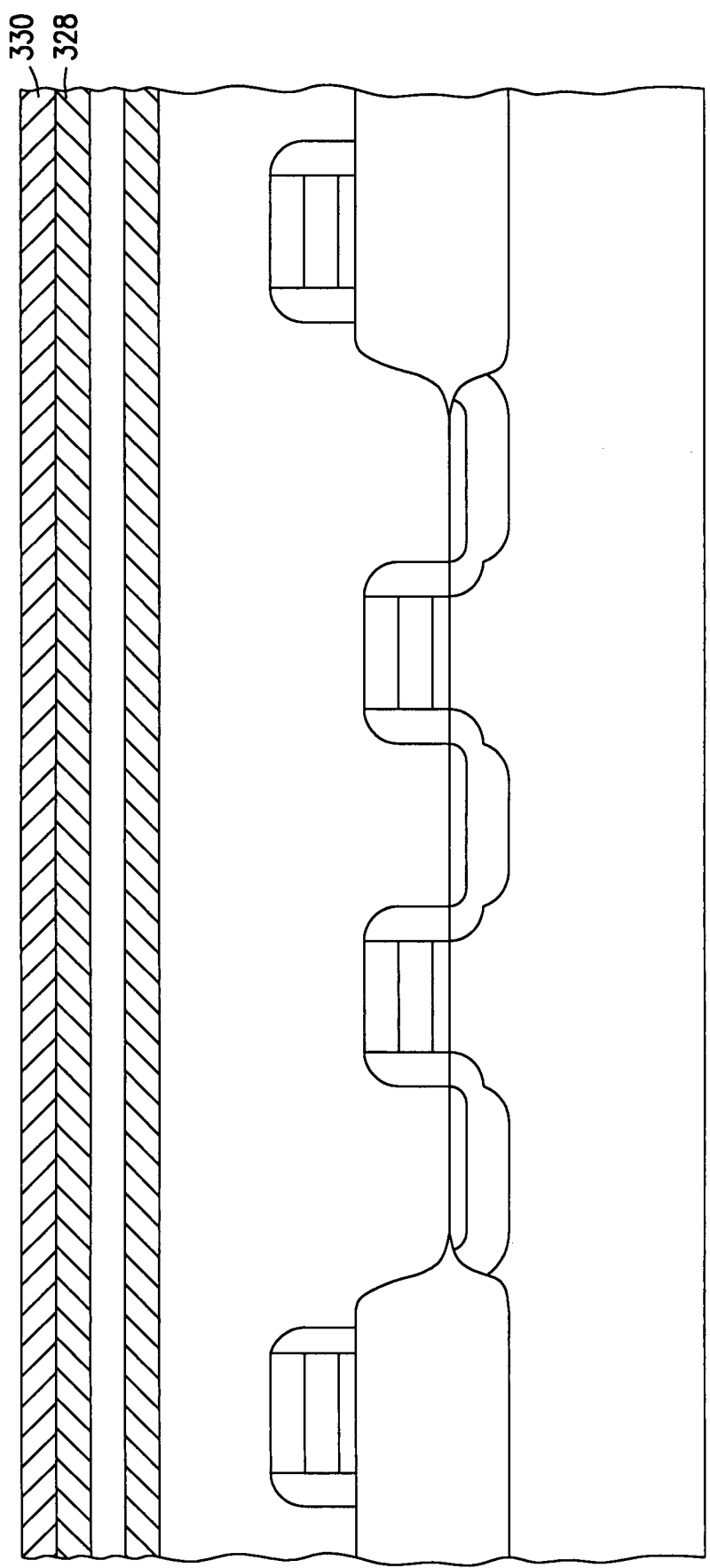
Figure 3G:
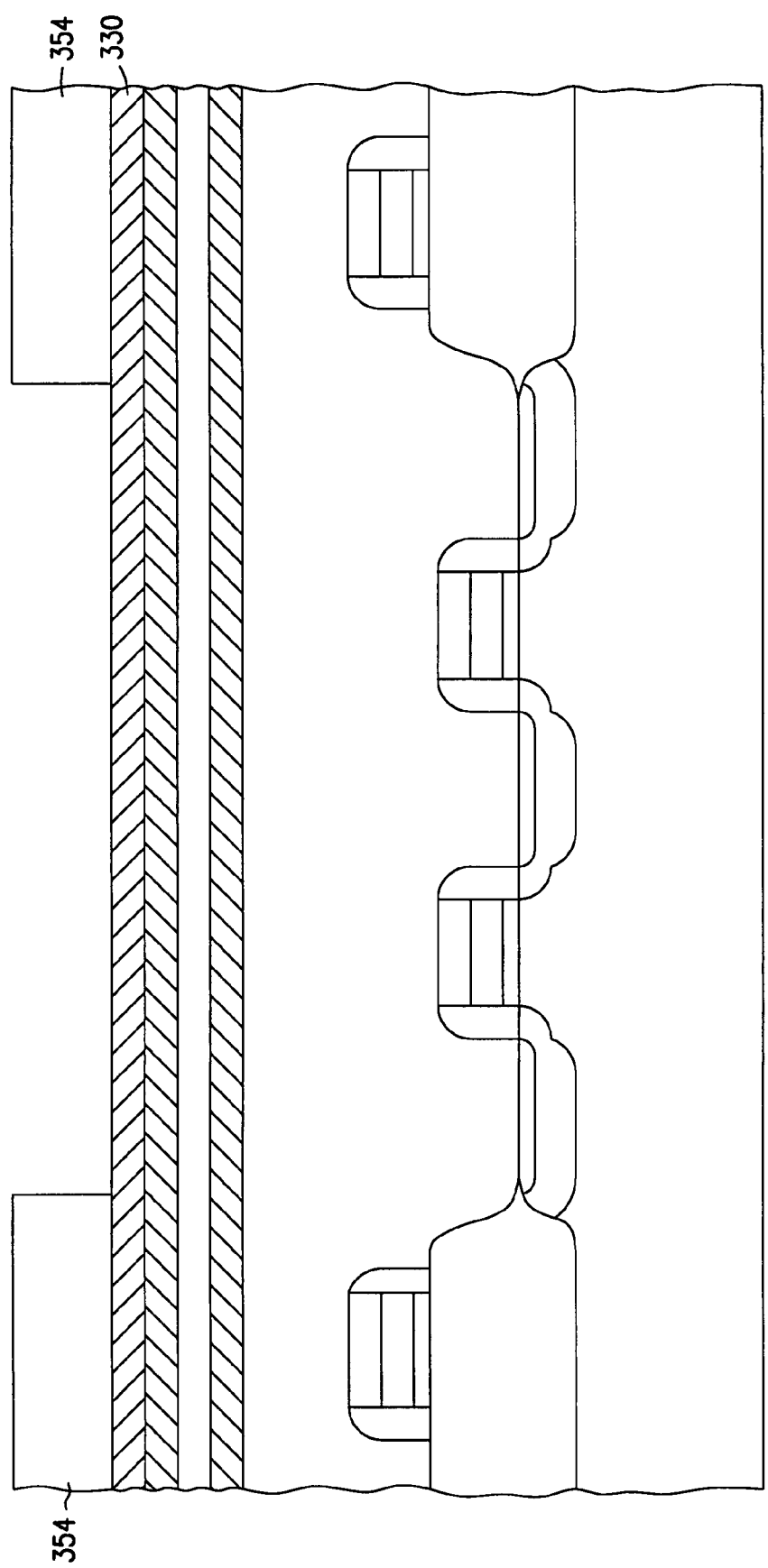
Figure 3H:
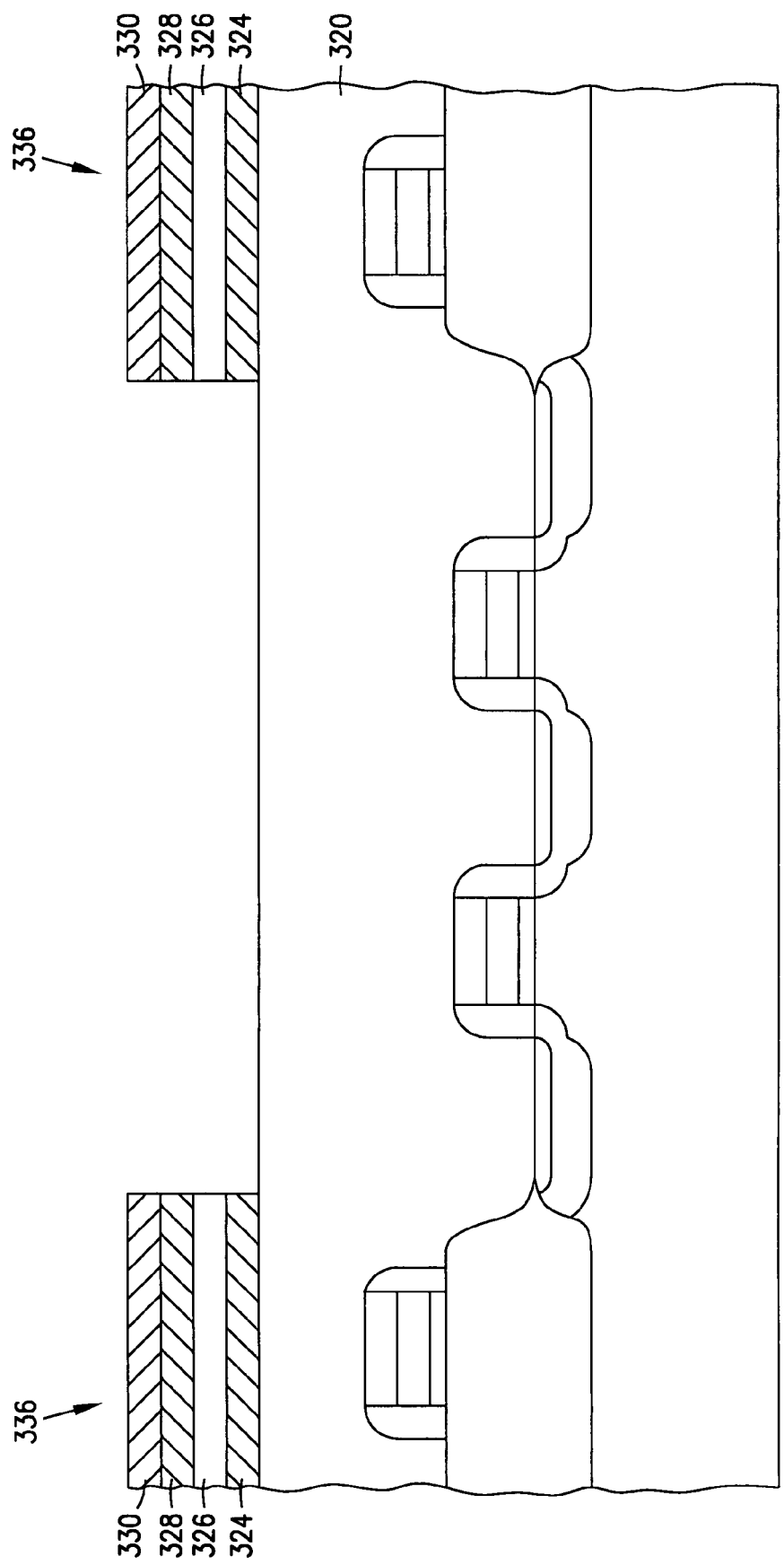
Figure 31:
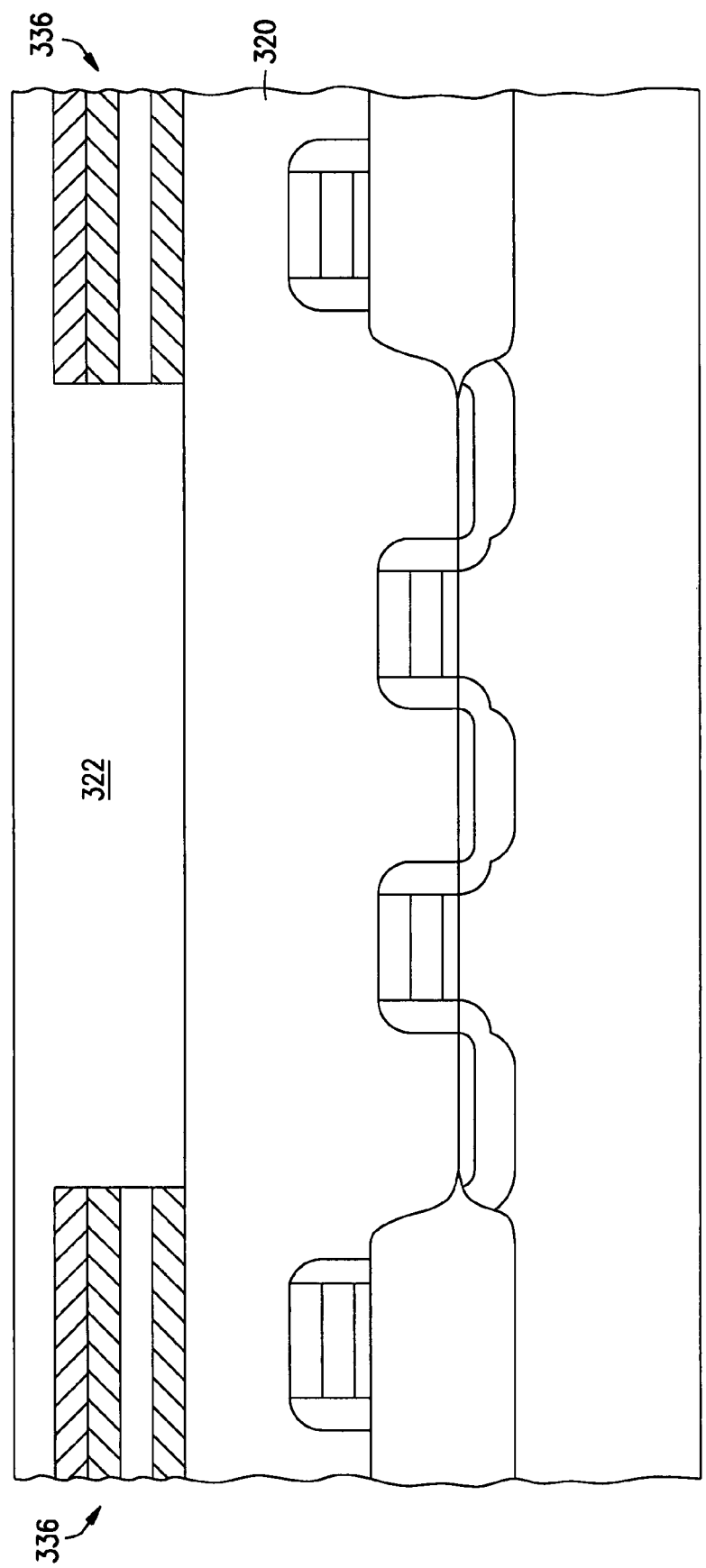
Figure 3J:
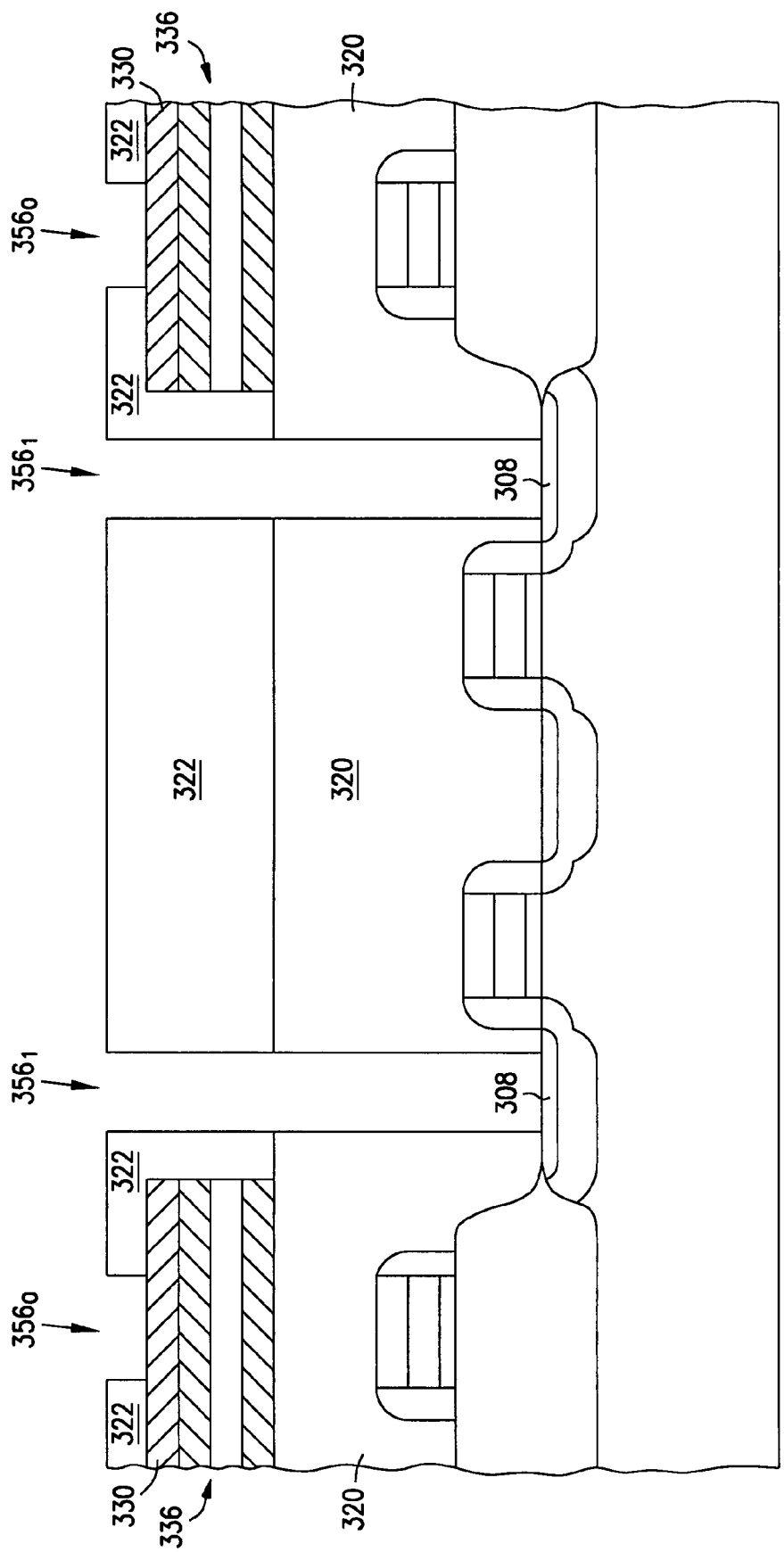
Figure 3K:
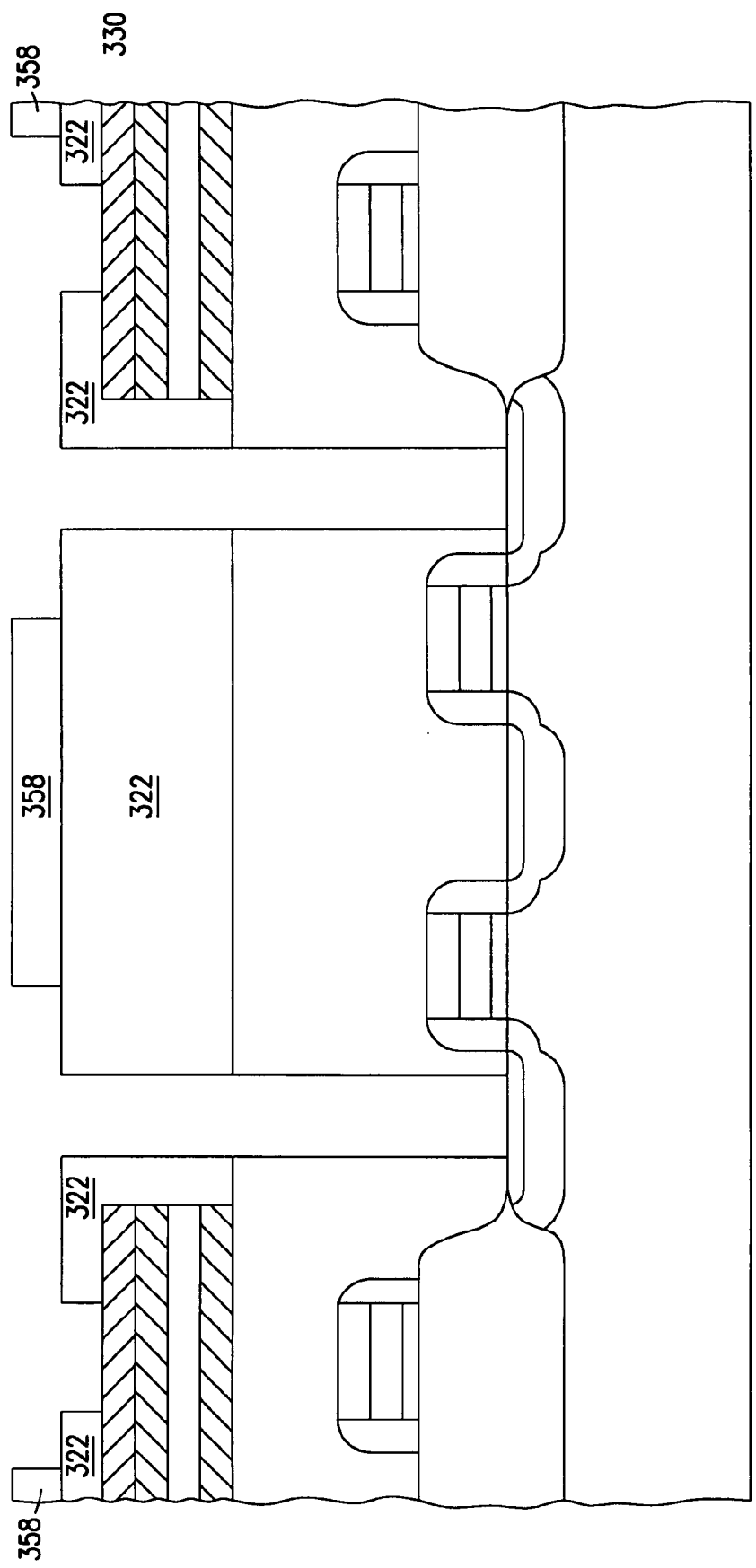
Figure 3L:
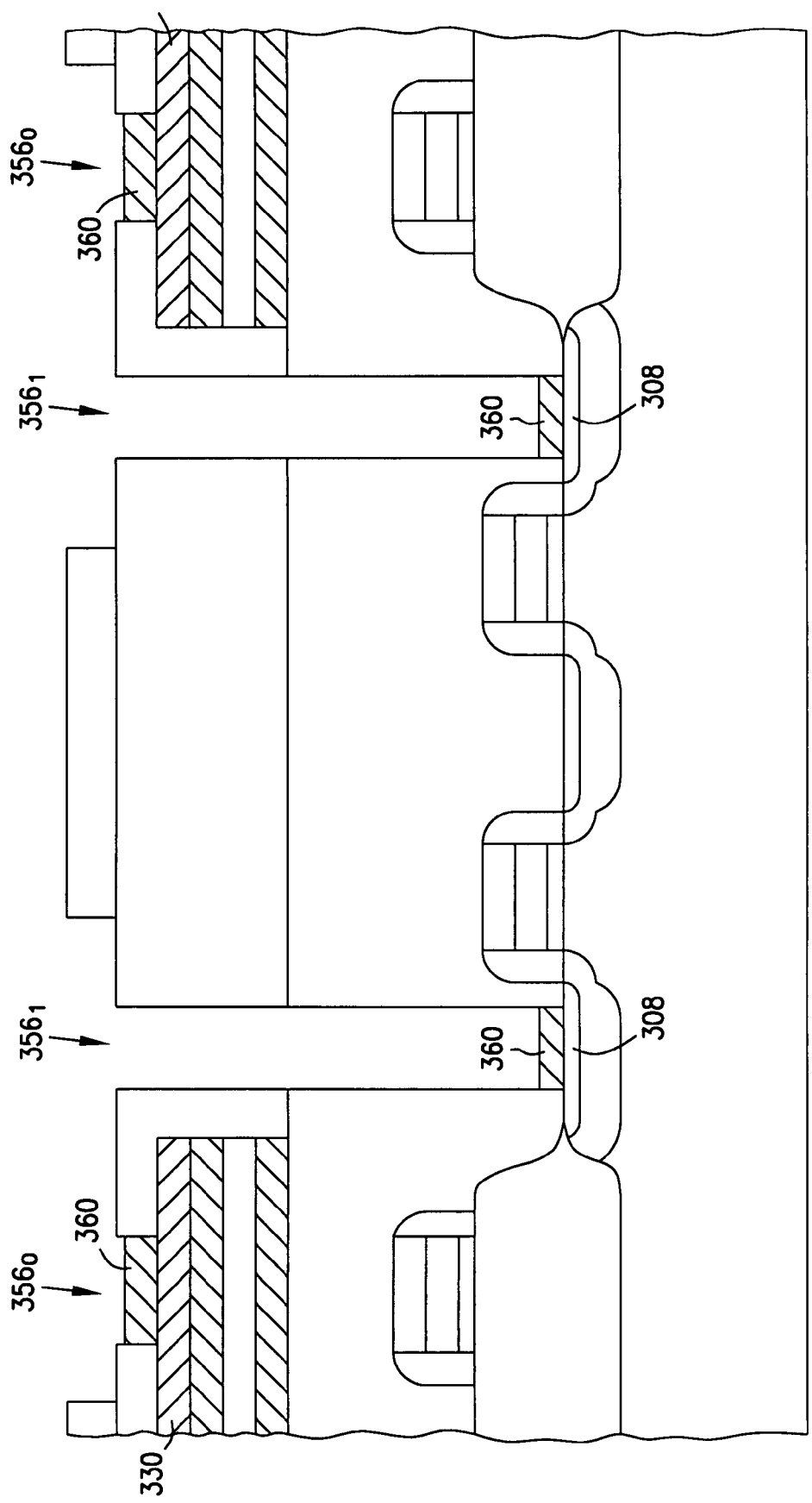
Figure 3M:
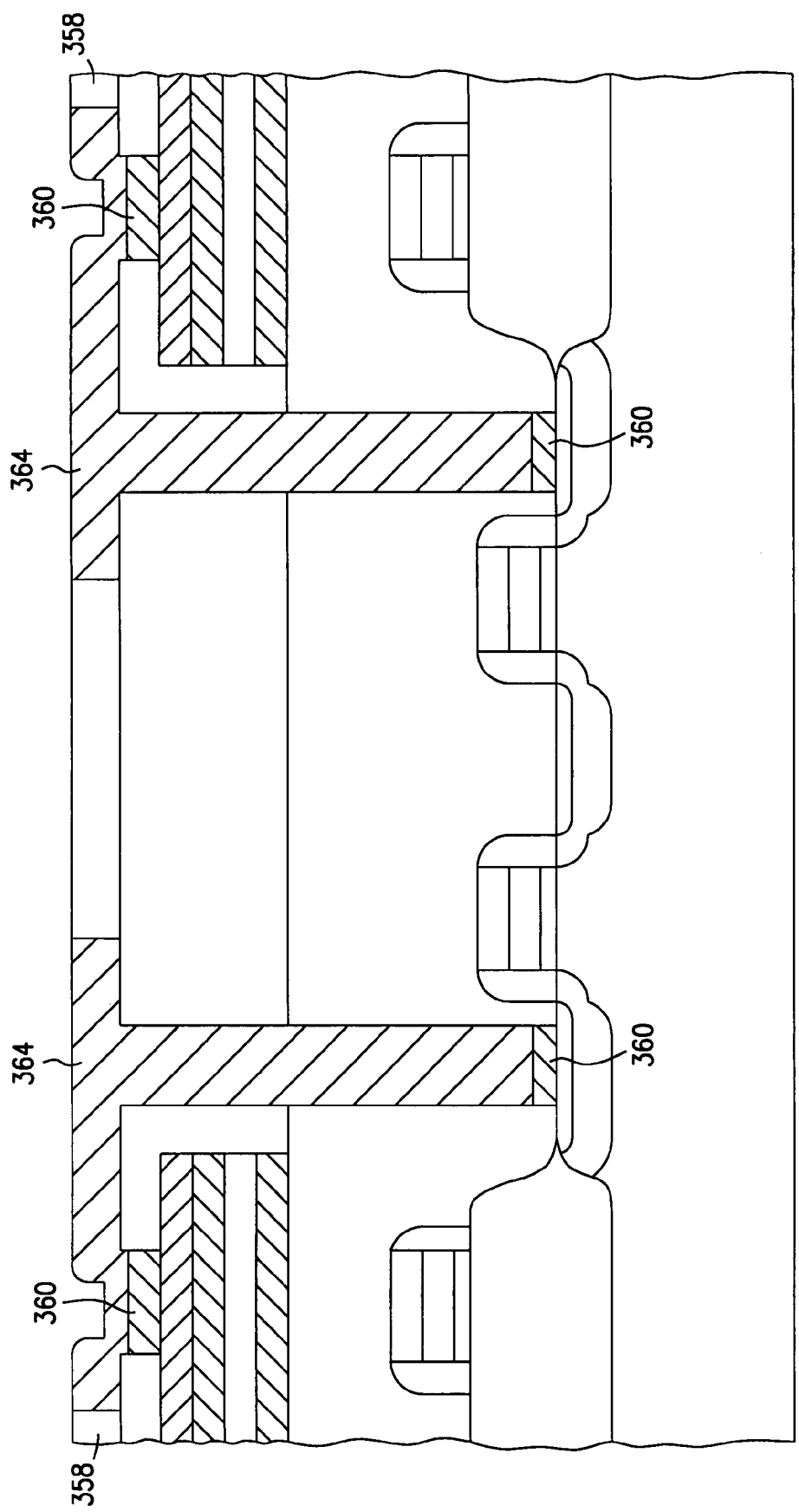
Figure 3N:
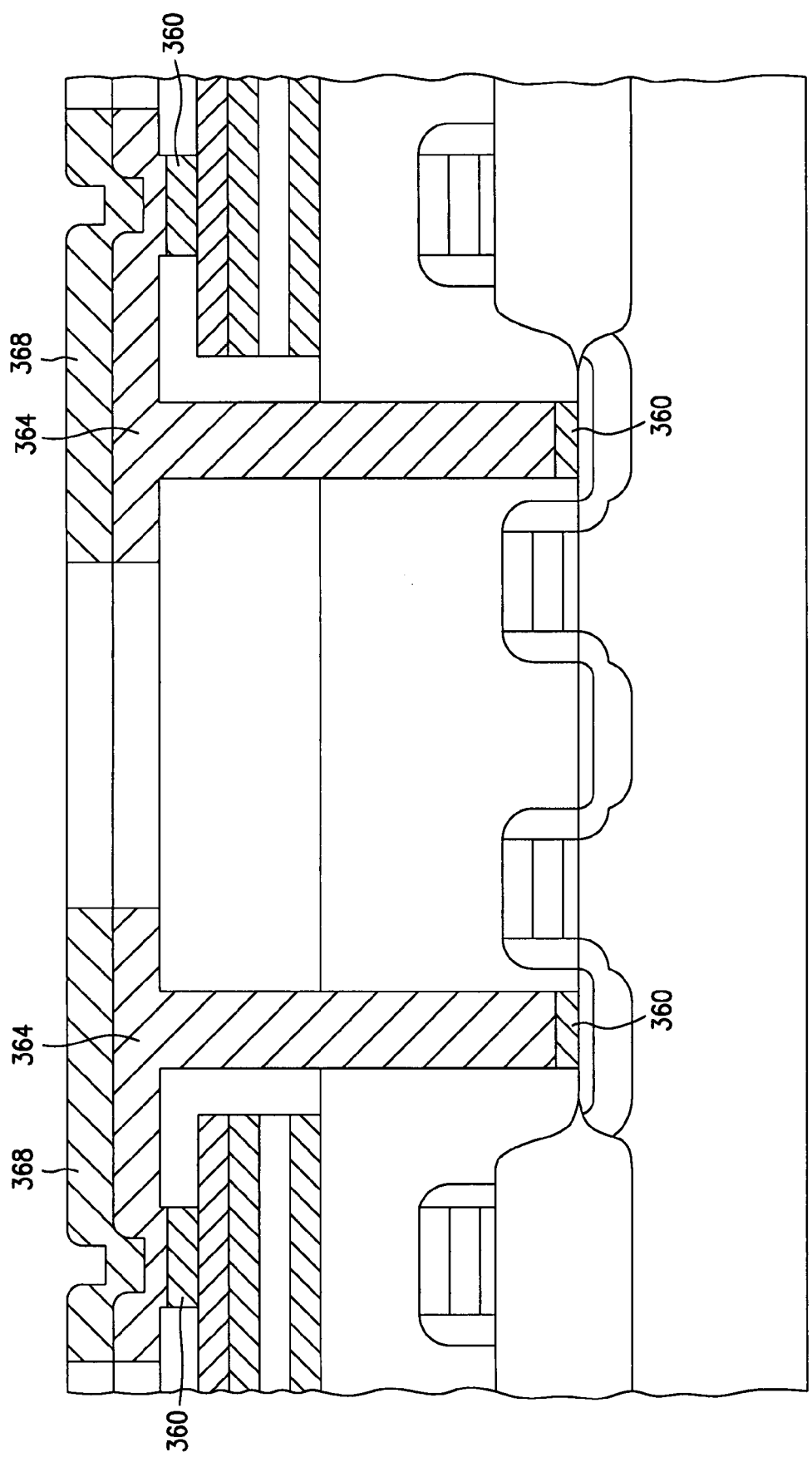
Figure 3O:
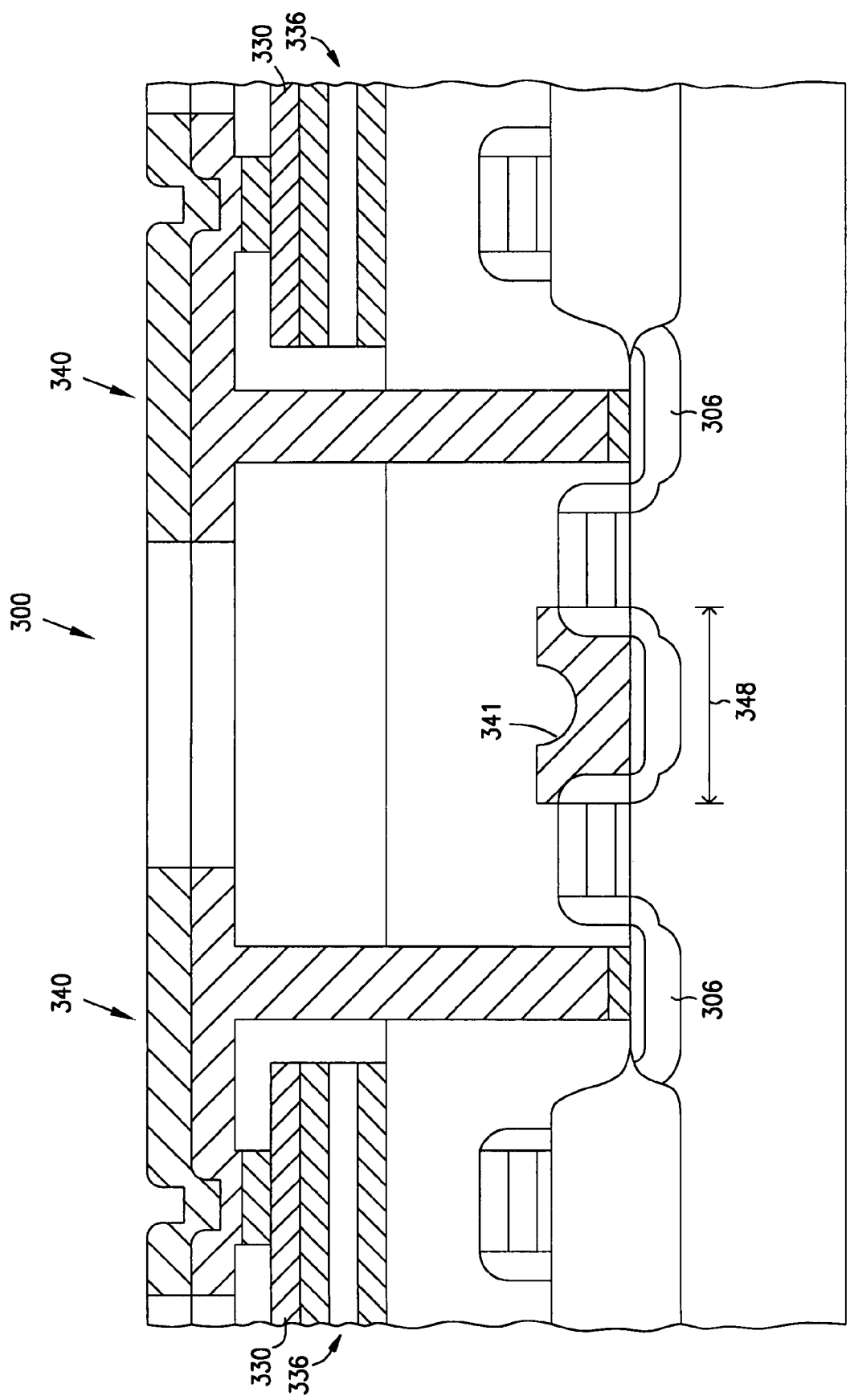

FIGS. 3A-3O are cross-sectional views of a semiconductor structure during processing according to one embodiment of the present invention. FIGS. 3A-3O are cross-sectional views taken along line A-AN of FIG. 2 during various processing stages.

Semiconductor structure 300 includes a substrate 302. The substrate 302 may be a silicon substrate, such as a p-type silicon substrate. Field isolators 304 are formed over field isolation regions 352 of the substrate 302. Field isolators 304 are generally formed of an insulator material, such as silicon oxides, silicon nitrides, or silicon oxynitrides. In this embodiment, field isolators 304 are formed of silicon dioxide such as by conventional local oxidation of silicon which creates substantially planar regions of oxide on the substrate surface. Active area 350 is an area not covered by the field isolators 304 on the substrate 302. The creation of the field isolators 304 is preceded or followed by the formation of a gate dielectric layer 314. In this embodiment, gate dielectric layer 314 is a thermally grown silicon dioxide, but other insulator materials may be used as described herein.

The creation of the field isolators 304 and gate dielectric layer 314 is followed by the formation of a conductively doped gate layer 316, silicide layer 308, and gate spacers 312. These layers and spacers are formed by methods well known in the art. The foregoing layers are patterned to form word lines in word line regions 344 and 346. A portion of these word lines is illustratively represented by gates $338_0$, $338_1$, $338_2$, and $338_3$. In one embodiment, the silicide layer 308 includes a refractory metal layer over the conductively doped gate layer 316, such as a polysilicon layer.

Source/drain regions 306 are formed on the substrate 302 such as by conductive doping of the substrate. Source/drain regions 306 have a conductivity opposite the substrate 302. For a p-type substrate, source/drain regions 306 would have an n-type conductivity. The source/drain regions 306 include lightly doped source/drain regions 310 that are formed by implanting a low-dose substance, such as an n-type or p-type material. Such lightly doped source/drain regions 310 help to reduce high field in the source/drain junctions of small-geometry semiconductor structure, such as semiconductor structure 300. The portion of the word lines that are illustratively represented by gates $338_0$, $338_1$, $338_2$, and $338_3$ is adapted to be coupled to periphery contacts (not shown). The periphery contacts are located at the end of a memory array and are adapted for electrical communication with external circuitry.

The foregoing discussion is illustrative of one example of a portion of a fabrication process to be used in conjunction with the various embodiments of the invention. Other methods of fabrication are also feasible and perhaps equally viable. For clarity purposes, many of the reference numbers are eliminated from subsequent drawings so as to focus on the portion of interest of the semiconductor structure 300.

FIG. 3B shows the semiconductor structure following the next sequence of processing. A thick insulation layer 320 is deposited overlying substrate 302 as well as field isolation regions 352, and active regions 350. Insulation layer 320 is an insulator material such as silicon oxide, silicon nitride, and silicon oxynitride. In one embodiment, insulation layer 320 is a doped insulator material such as borophosphosilicate glass (BPSG), a boron and phosphorous-doped silicon oxide. The insulation layer 320 is planarized, such as by chemical-mechanical planarization (CMP), in order to provide a uniform height.

FIG. 3C shows the semiconductor structure following the next sequence of processing. A conductive layer 324 is formed abutting the insulation layer 320. The conductive layer 324 includes a conductive material. In one embodiment, the conductive layer 324 includes at least one conductive metal oxide. In another embodiment, the conductive metal oxide is selected from a group consisting of ruthenium oxide and iridium oxide.

The conductive layer 324 may be formed by any method, such as collimated sputtering, chemical vapor deposition (CVD), or other deposition techniques. In this embodiment, the conductive layer 324 is patterned to form the bottom conductive layer, or bottom electrode, or bottom plate of a semiconductor structure of interest, such as a capacitor.

FIG. 3D shows the semiconductor structure following the next sequence of processing. An insulation layer 326 is formed abutting the conductive layer 324. In one embodiment, the insulation layer 326 contains a dielectric material having a high dielectric constant. In another embodiment, the insulation layer 326 contains a dielectric material having a dielectric constant greater than about 7. In another embodiment, the insulation layer 326 contains a dielectric material having a dielectric constant greater than about 50. In yet another embodiment, the insulation layer 326 contains at least one metal oxide dielectric material. In a further embodiment, the insulation layer 326 contains ditantalum pentaoxide ($Ta_2O_5$). The insulation layer 326 may be formed by any method, such as collimated sputtering, chemical vapor deposition, or other deposition techniques.

FIG. 3E shows the semiconductor structure following the next sequence of processing. A conductive layer 328 is formed abutting the insulation layer 326. The conductive layer 328 includes a conductive material. In one embodiment, the conductive layer 328 includes at least one conductive metal oxide. In another embodiment, the conductive metal oxide is selected from a group consisting of ruthenium oxide and iridium oxide.

The conductive layer 328 may be formed by any method, such as collimated sputtering, chemical vapor deposition (CVD), or other deposition techniques. In this embodiment, the conductive layer 328 forms the top conductive layer, or top electrode, or top plate of a semiconductor structure of interest, such as a capacitor.

FIG. 3F shows the semiconductor structure following the next sequence of processing. An inhibiting layer 330 is formed abutting the conductive layer 328. In one embodiment, the inhibiting layer comprises a material that is selected from a group consisting of a transition metal, a transition metal alloy, a nitride compound, a noble metal, and a noble metal alloy. In another embodiment, the transition metal is selected from a group consisting of platinum, rhodium, and tungsten. In yet another embodiment, the transition metal alloy includes a platinum rhodium alloy. In a further embodiment, the nitride compound is selected from a group consisting of tungsten nitride and titanium nitride. In another embodiment, the noble metal includes platinum, gold, titanium, and silver. In yet a further embodiment, the noble metal alloy includes graphite, chlorimet 3, and hastelloy C. In the embodiment in which the inhibiting layer 330 overlies the conductive layer 328, the inhibiting layer 330 may be formed by any suitable method, such as collimated sputtering, chemical vapor deposition (CVD), or physical vapor deposition. In the embodiment in which the inhibiting layer 330 is embedded in the conductive layer 328, the inhibiting layer 330 may be implanted using a shallow implantation technique or other suitable embedding techniques.

FIG. 3G shows the semiconductor structure following the next sequence of processing. A mask 354 is formed abutting a portion of the inhibiting layer 330. The mask 354 is patterned to define future locations of the semiconductor structure of interest, such as a capacitor.

FIG. 3H shows the semiconductor structure following the next sequence of processing. Portions of the inhibiting layer 330, conductive layer 338, insulation layer 326, and conductive layer 334 are exposed where the mask 354 does not cover. These exposed portions are selectively removed as well as the mask 354. Once these exposed portions are removed, semiconductor structures of interest, such as capacitors 336, are defined and remained abutting the insulation layer 320. These exposed portions may be removed by etching or by other suitable removal techniques known in the art. Removal techniques are generally dependent upon the material of construction of the layer to be removed as well as the surrounding layers to be retained.

FIG. 3I shows the semiconductor structure following the next sequence of processing. An insulation layer 322 is deposited abutting the capacitors 336 as well as insulation layer 320. Insulation layer 322 is an insulator material such as silicon oxide, silicon nitride, and silicon oxynitride. In one embodiment, insulation layer 322 is a doped insulator material such as borophosphosilicate glass (BPSG), a boron and phosphorous-doped silicon oxide. The insulation layer 322 is planarized, such as by chemical-mechanical planarization (CMP), in order to provide a uniform height.

FIG. 3J shows the semiconductor structure following the next sequence of processing. Portions of the insulation layers 320 and 322 are selectively masked and patterned using any suitable photolithography techniques. Once masked and patterned, the insulation layers 320 and 322 are etched to define plugs or vias (hereinafter, holes). Once these portions are etched, holes $356_0$ and $356_1$ are defined to expose the inhibiting layers 330 of the capacitors 336 and the silicide contacts 308. Besides etching, these portions may be removed by other suitable removal techniques known in the art. Removal techniques are generally dependent upon the material of construction of the layer to be removed as well as the surrounding layers to be retained.

FIG. 3K shows the semiconductor structure following the next sequence of processing. An insulation layer 358 is patterned and etched using any suitable photolithography techniques. The insulation layer 358 is defined to abut a portion of the insulation layer 322. Insulation layer 358 is an insulator material such as silicon oxide, silicon nitride, or silicon oxynitride. In one embodiment, insulation layer 358 is a doped insulator material such as borophosphosilicate glass (BPSG), a boron and phosphorous-doped silicon oxide. The insulation layer 358 is planarized, such as by chemical-mechanical planarization (CMP), in order to provide a uniform height.

FIG. 3L shows the semiconductor structure following the next sequence of processing. A first layer 360 of a metallization layer is formed to fill a portion of the holes $356_0$ and $356_1$. The first layer 360 includes any conductive material that resists diffusion. Hence, the first layer 360 may be considered a diffusion barrier layer or a portion of a diffusion barrier layer of the metallization layer. In one embodiment, the first layer 360 includes a transition metal, such as titanium. In another embodiment, the first layer 360 includes a nitride compound, a carbide compound, a boride compound, a transition metal alloy, and a transition metal nitride compound alloy. In yet another embodiment, the nitride compound includes titanium nitride. In a further embodiment, the transition metal alloy includes titanium tungsten. In yet a further embodiment, the transition metal nitride compound alloy includes titanium nitride tungsten. In another embodiment, the first layer 360 may be selected from either a noble metal or a noble metal alloy. The noble metal includes platinum, gold, titanium, and silver. The noble metal alloy includes graphite, chlorimet 3, and hastelloy C. The first layer 360 may be formed by any method, such as collimated sputtering, chemical vapor deposition (CVD), or other deposition techniques.

FIG. 3M shows the semiconductor structure following the next sequence of processing. A second layer 364 of a metallization layer is optionally formed through masking and patterning through a suitable photolithography technique. The second layer 364 is formed abutting the first layer 360 and the insulating layer 358. In one embodiment, the second layer 364 is a conductive layer that includes a transition metal, such as tungsten. The second layer 364 may be formed by any method, such as collimated sputtering, chemical vapor deposition (CVD), or other deposition techniques.

FIG. 3N shows the semiconductor structure following the next sequence of processing. Another layer 368 of the metallization layer is formed abutting the second layer 364. The layer 368 includes any conductive material. In one embodiment, the layer 368 includes a transition metal, such as aluminum. The layer 368 may be formed by any method, such as collimated sputtering, chemical vapor deposition (CVD), or other deposition techniques.

FIG. 3O shows the semiconductor structure following the next sequence of processing. A digit line contact 341 is formed over the digit line contact regions 348. The formation of the digit line contact 341 and the completion of the semiconductor structure 300 do not limit the embodiments of the present invention and as such will not be discussed here in detail. FIG. 3O shows a semiconductor structure complete with metallization layer 340 in contact with the source/drain regions 306 and the capacitors 336.

The inhibiting layer 330 acts to inhibit an open contact from occurring between the metallization layer 340 and the semiconductor structures of interest, such as capacitors 336. In one embodiment, the inhibiting layer 330 acts to inhibit formation of an undesired dielectric. In another embodiment, the inhibiting layer 330 acts to inhibit a diffusion that increases resistivity. In another embodiment, the inhibiting layer 330 acts to inhibit formation of an undesired oxidation compound so as to enhance an ohmic contact between the metallization layer 340 and the capacitors 336.

Figure 4:
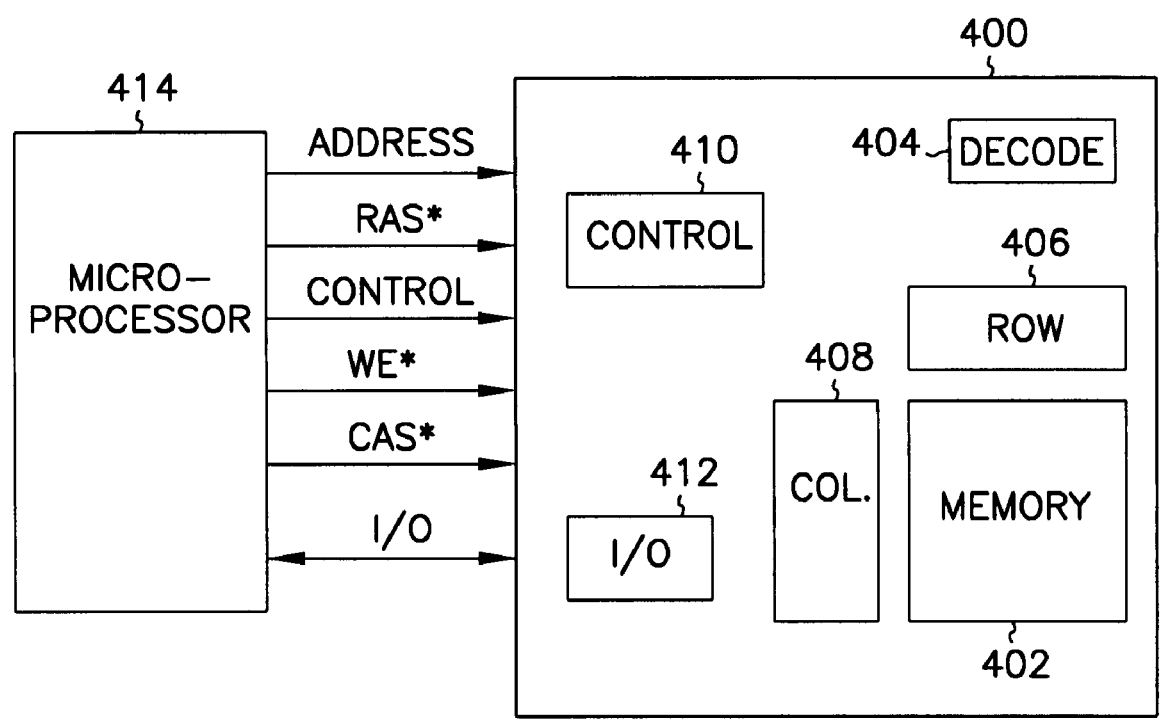
FIG. 4 is a block diagram of a device according to one embodiment of the present invention.

FIG. 4 is a block diagram of a device according to one embodiment of the present invention. The memory device 400 includes an array of memory cells 402, address decoder 404, row access circuitry 406, column access circuitry 408, control circuitry 410, and input/output circuit 412. The memory device 400 can be coupled to an external microprocessor 414, or memory controller for memory accessing. The memory device 400 receives control signals from the processor 414, such as WE*, RAS* and CAS* signals. The memory device 400 is used to store data which is accessed via I/O lines. It will be appreciated by those skilled in the art that additional circuitry and control signals can be provided, and that the memory device 400 has been simplified to help focus on the invention. At least one of the memory cells has an inhibiting layer in accordance with the aforementioned embodiments.

It will be understood that the above description of a DRAM (Dynamic Random Access Memory) is intended to provide a general understanding of the memory and is not a complete description of all the elements and features of a DRAM. Further, the invention is equally applicable to any size and type of memory circuit and is not intended to be limited to the DRAM described above. Other alternative types of devices include SRAM (Static Random Access Memory) or Flash memories. Additionally, the DRAM could be a synchronous DRAM commonly referred to as SGRAM (Synchronous Graphics Random Access Memory), SDRAM (Synchronous Dynamic Random Access Memory), SDRAM II, and DDR SDRAM (Double Data Rate SDRAM), as well as Synchlink or Rambus DRAMs and other emerging memory technologies.

As recognized by those skilled in the art, memory devices of the type described herein are generally fabricated as an integrated circuit containing a variety of semiconductor devices. The integrated circuit is supported by a substrate. Integrated circuits are typically repeated multiple times on each substrate. The substrate is further processed to separate the integrated circuits into dies as is well known in the art.

Figure 5:
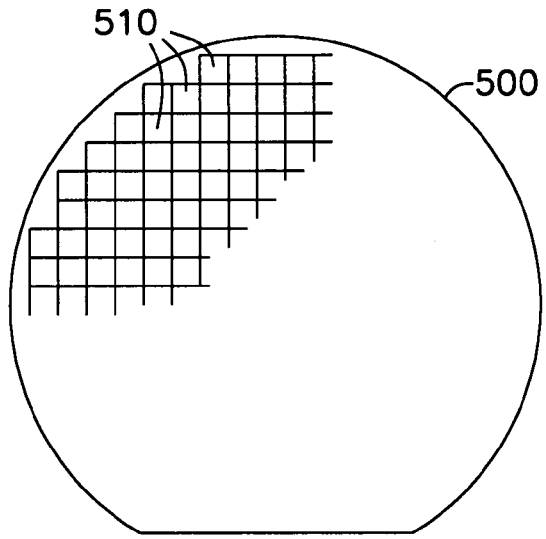
FIG. 5 is an elevation view of a semiconductor wafer according to one embodiment of the present invention.

FIG. 5 is an elevation view of a semiconductor wafer according to one embodiment of the present invention. In one embodiment, a semiconductor die 510 is produced from a wafer 500. A die is an individual pattern, typically rectangular, on a substrate that contains circuitry, or integrated circuit devices, to perform a specific function. At least one of the integrated circuit devices includes a memory cell that has an inhibiting layer as discussed in the various embodiments heretofore in accordance with the invention. A semiconductor wafer will typically contain a repeated pattern of such dies containing the same functionality. Die 510 may contain circuitry for the inventive memory device, as discussed above. Die 510 may further contain additional circuitry to extend to such complex devices as a monolithic processor with multiple functionality. Die 510 is typically packaged in a protective casing (not shown) with leads extending therefrom (not shown) providing access to the circuitry of the die for unilateral or bilateral communication and control.

Figure 6:
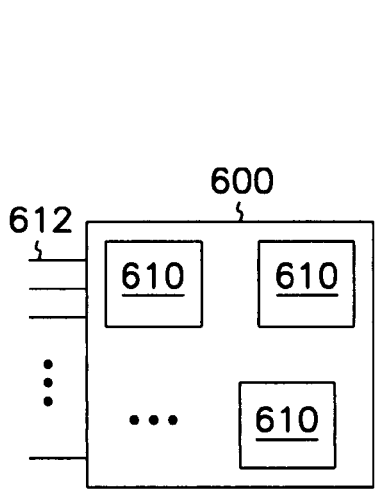
FIG. 6 is a block diagram of a circuit module according to one embodiment of the present invention.

FIG. 6 is a block diagram of a circuit module according to one embodiment of the present invention. Two or more dies 610 may be combined, with or without protective casing, into a circuit module 600 to enhance or extend the functionality of an individual die 610. Circuit module 600 may be a combination of dies 610 representing a variety of functions, or a combination of dies 610 containing the same functionality. One or more dies 610 of circuit module 600 contain at least one inhibiting layer in accordance with the embodiments of the present invention.

Some examples of a circuit module include memory modules, device drivers, power modules, communication modems, processor modules, and application-specific modules, and may include multilayer, multichip modules. Circuit module 600 may be a subcomponent of a variety of electronic systems, such as a clock, a television, a cell phone, a personal computer, an automobile, an industrial control system, an aircraft, and others. Circuit module 600 will have a variety of leads 612 extending therefrom and coupled to the dies 610 providing unilateral or bilateral communication and control.

Figure 7:
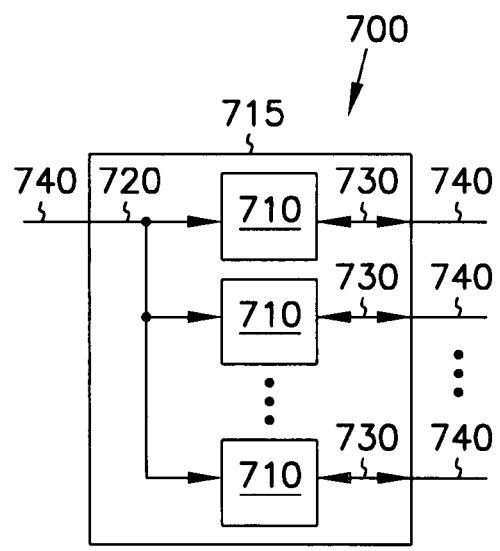
FIG. 7 is a block diagram of a memory module according to one embodiment of the present invention.

FIG. 7 is a block diagram of a memory module according to one embodiment of the present invention. Memory module 700 contains multiple memory devices 710 contained on support 715, the number depending upon the desired bus width and the desire for parity. Memory module 700 accepts a command signal from an external controller (not shown) on a command link 720 and provides for data input and data output on data links 730. The command link 720 and data links 730 are connected to leads 740 extending from the support 715. Leads 740 are shown for conceptual purposes and are not limited to the positions as shown. At least one of the memory devices 710 includes a memory cell that includes an inhibiting layer as discussed in various embodiments in accordance with the invention.

Figure 8:
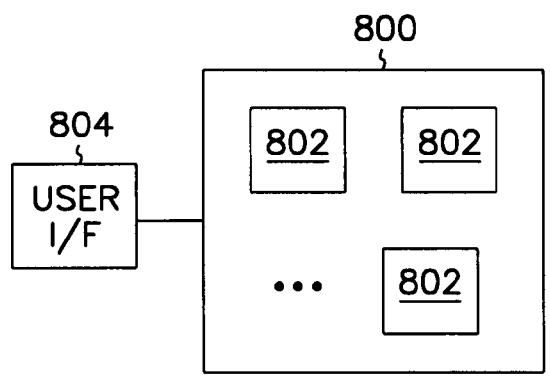
FIG. 8 is a block diagram of a system according to one embodiment of the present invention.

FIG. 8 is a block diagram of a system according to one embodiment of the present invention. Electronic system 800 contains one or more circuit modules 802. Electronic system 800 generally contains a user interface 804. User interface 804 provides a user of the electronic system 800 with some form of control or observation of the results of the electronic system 800. Some examples of user interface 804 include the keyboard, pointing device, monitor, or printer of a personal computer; the tuning dial, display, or speakers of a radio; the ignition switch, gauges, or gas pedal of an automobile; and the card reader, keypad, display, or currency dispenser of an automated teller machine. User interface 804 may further describe access ports provided to electronic system 800. Access ports are used to connect an electronic system to the more tangible user interface components previously exemplified. One or more of the circuit modules 802 may be a processor providing some form of manipulation, control, or direction of inputs from or outputs to user interface 804, or of other information either preprogrammed into, or otherwise provided to, electronic system 800. As will be apparent from the lists of examples previously given, electronic system 800 will often contain certain mechanical components (not shown) in addition to circuit modules 802 and user interface 804. It will be appreciated that the one or more circuit modules 802 in electronic system 800 can be replaced by a single integrated circuit. Furthermore, electronic system 800 may be a subcomponent of a larger electronic system. At least one of the circuit modules 802 includes a memory cell that includes an inhibiting layer as discussed in various embodiments in accordance with the invention.

Figure 9:
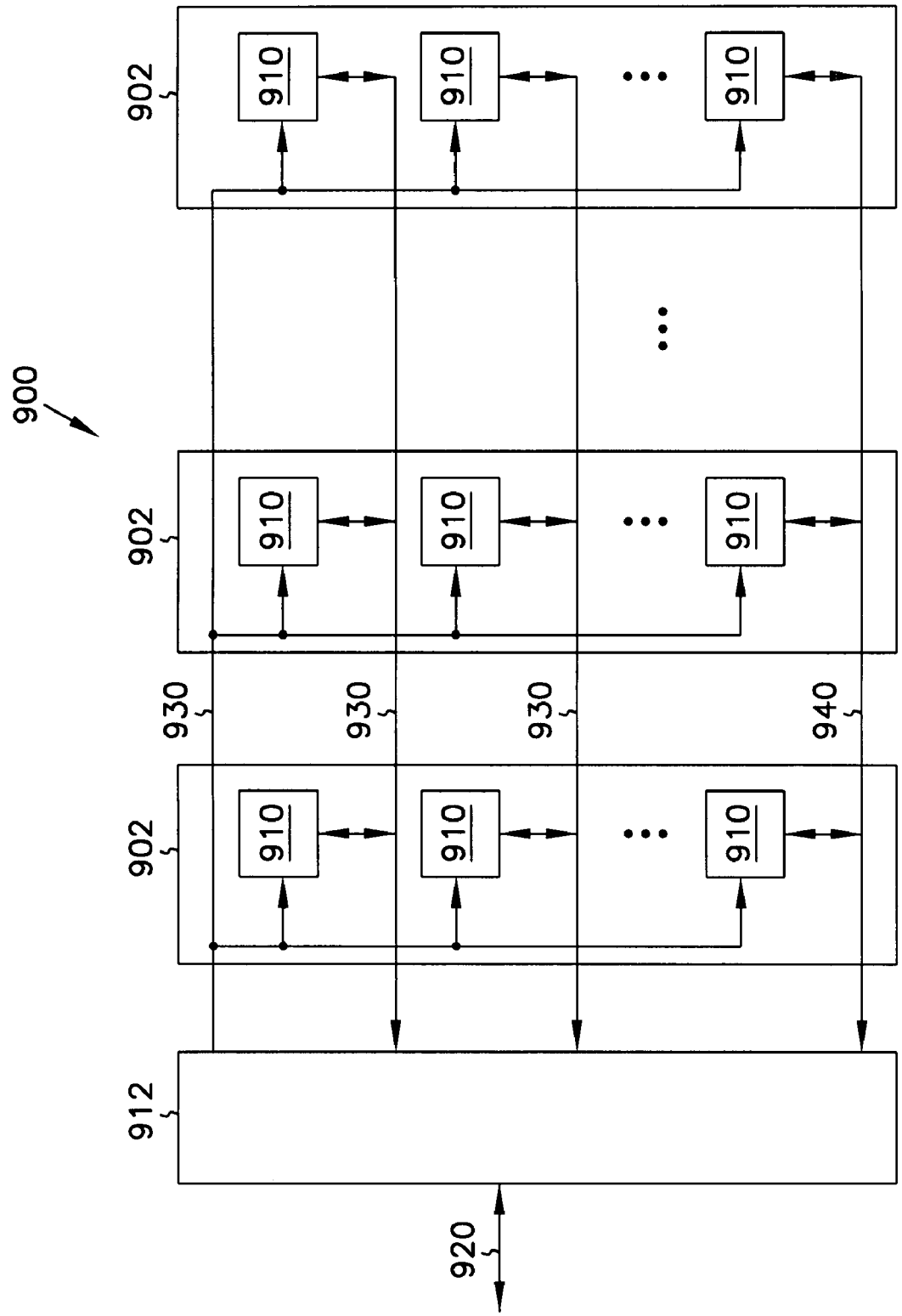
FIG. 9 is a block diagram of a system according to one embodiment of the present invention.

FIG. 9 is a block diagram of a system according to one embodiment of the present invention. Memory system 900 contains one or more memory modules 902 and a memory controller 912. Each memory module 902 includes at least one memory device 910. Memory controller 912 provides and controls a bidirectional interface between memory system 900 and an external system bus 920. Memory system 900 accepts a command signal from the external bus 920 and relays it to the one or more memory modules 902 on a command link 930. Memory system 900 provides for data input and data output between the one or more memory modules 902 and external system bus 920 on data links 940. At least one of the memory devices 910 includes a memory cell that includes an inhibiting layer as discussed in various embodiments in accordance with the invention.

Figure 10:
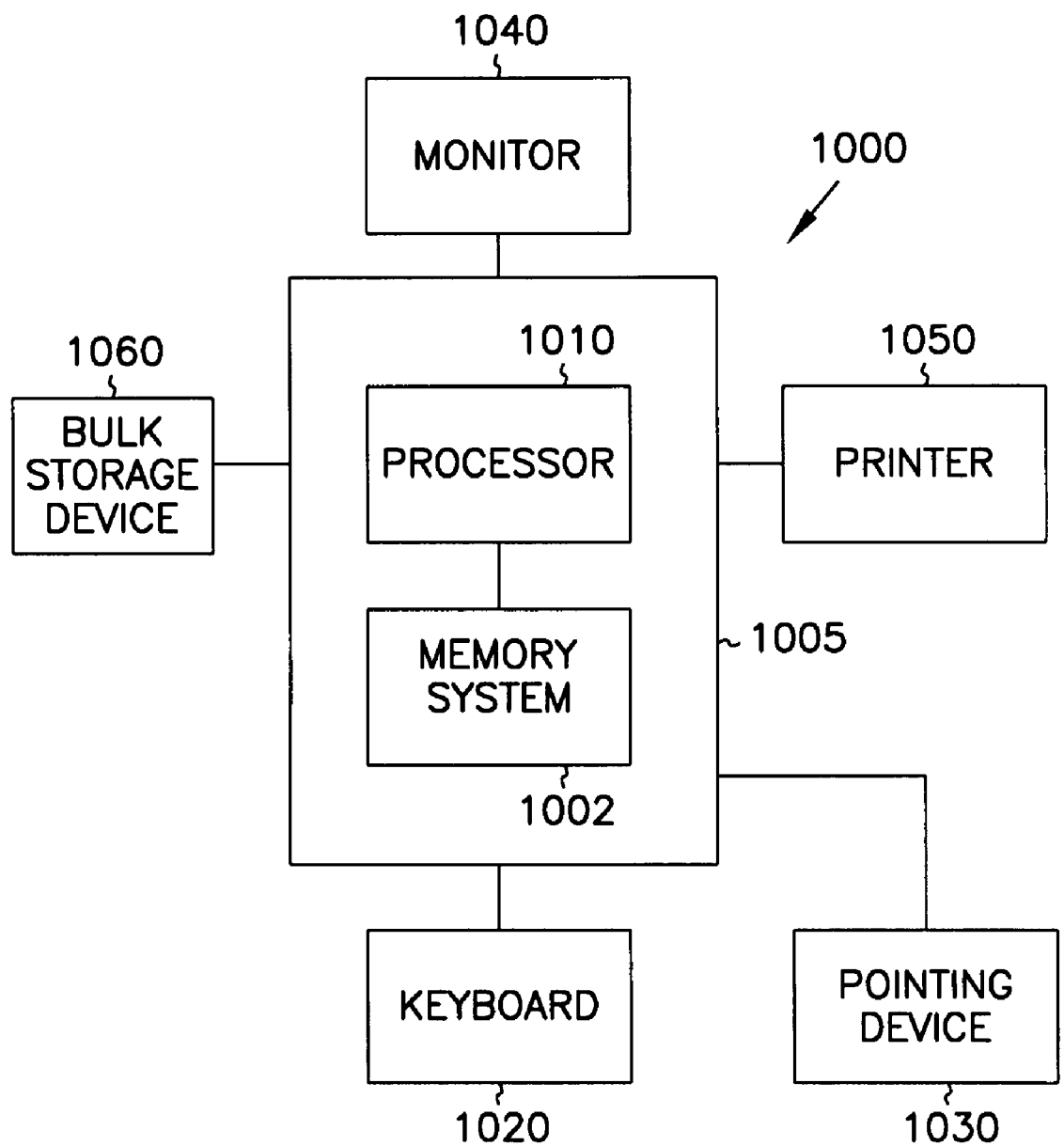
FIG. 10 is a block diagram of a system according to one embodiment of the present invention.

FIG. 10 is a block diagram of a system according to one embodiment of the present invention. Computer system 1000 contains a processor 1010 and a memory system 1002 housed in a computer unit 1005. Computer system 1000 is but one example of an electronic system containing another electronic system, e.g., memory system 1002, as a subcomponent. The memory system 1002 may include a memory cell that includes an inhibiting layer as discussed in various embodiments of the present invention. Computer system 1000 optionally contains user interface components. These user interface components include a keyboard 1020, a pointing device 1030, a monitor 1040, a printer 1050, and a bulk storage device 1060. It will be appreciated that other components are often associated with computer system 1000 such as modems, device driver cards, additional storage devices, etc. It will further be appreciated that the processor 1010 and memory system 1002 of computer system 1000 can be incorporated on a single integrated circuit. Such single-package processing units reduce the communication time between the processor and the memory circuit.

Conclusion

Systems, devices, structures, and methods have been described to address situations where a metallization layer acts with one of the conductive layers of a capacitor such that an opened contact exists between the metallization layer and the capacitor. Capacitors that use the inhibiting layer as described heretofore benefit from the dual ability of having an increase in storage capability yet a decrease in space requirement. As described heretofore, the inhibiting layer inhibits diffusion between two solids at a predetermined temperature. The inhibition of such diffusion allows a capacitor to maintain good ohmic contact with the metallization layer. However, the inhibiting layer may also inhibit diffusion of molecules that may come from other parts of the semiconductor structure, such as the dielectric of the capacitor. While the various embodiments described heretofore have discussed the inhibition of diffusion of oxygen molecules, the structures and methods described can be used to inhibit diffusion of other chemical species through an appropriate choice of materials for the inhibiting layer.

Although the specific embodiments have been illustrated and described herein, it will be appreciated by those of ordinary skill in the art that any arrangement which is calculated to achieve the same purpose may be substituted for the specific embodiment shown. This application is intended to cover any adaptations or variations of the present invention. It is to be understood that the above description is intended to be illustrative, and not restrictive. Combinations of the above embodiments and other embodiments will be apparent to those of skill in the art upon reviewing the above description. The scope of the invention includes any other applications in which the above structures and fabrication methods are used. Accordingly, the scope of the invention should only be determined with reference to the appended claims, along with the full scope of equivalents to which such claims are entitled.

I claim:

1. A method of forming a semiconductor structure, the method comprising:
    forming a first conductive layer over a substrate wherein the first conductive layer includes a conductive metal oxide;
    forming an insulation layer abutting the first conductive layer;
    forming a second conductive layer abutting the insulation layer;
    forming an inhibiting layer over the second conductive layer, wherein the inhibiting layer inhibits formation of an undesired oxidation compound so as to enhance an ohmic contact;
    forming a diffusion barrier layer over the inhibiting layer and the second conductive layer; and
    forming a metalization layer, the metalization layer including a first portion coupled to the diffusion barrier layer, and a second portion coupled to the substrate.

2. The method of claim 1, wherein the conductive metal oxide is selected from a group consisting of ruthenium oxide and iridium oxide.

3. A method of forming a semiconductor structure, the method comprising:
    forming a first conductive layer over a substrate, wherein forming the first conductive layer includes forming the first conductive layer from at least one conductive metal oxide, wherein the at least one conductive metal oxide is selected from a group consisting of ruthenium oxide and iridium oxide;

forming an insulation layer abutting the first conductive layer, wherein the insulation layer includes at least one insulator metal oxide;

forming a second conductive layer abutting the insulation layer;

forming an inhibiting layer over the second conductive layer, wherein the inhibiting layer inhibits formation of an undesired oxidation compound so as to enhance an ohmic contact;

forming a diffusion barrier layer over the inhibiting layer and the second conductive layer; and forming a metalization layer, the metalization layer including a first portion coupled to the diffusion barrier layer, and a second portion coupled to the substrate.

4. The method of claim 3, wherein the insulator metal oxide includes ditantalum pentaoxide.

5. The method of claim 3, wherein the second conductive layer includes a conductive metal oxide.

6. The method of claim 5, wherein the conductive metal oxide is selected from a group consisting of ruthenium oxide and iridium oxide.

7. The method of claim 3, wherein the inhibiting layer includes a substance selected from a group consisting of a transition metal, a transition metal alloy, a nitride compound, a noble metal, and a noble metal alloy.

8. The method of claim 7, wherein the transition metal is selected from a group consisting of platinum, rhodium, and tungsten.

9. The method of claim 7, wherein the transition metal alloy includes a platinum rhodium alloy.

10. The method of claim 7, wherein the nitride compound is selected from a group consisting of tungsten nitride and titanium nitride.

11. A method of forming a semiconductor structure, the method comprising:

forming a first conductive layer over a substrate, wherein the first conductive layer comprises at least one conductive metal oxide, wherein the at least one conductive metal oxide is selected from a group consisting of ruthenium oxide and iridium oxide;

forming an insulation layer abutting the first conductive layer, wherein the insulation layer comprises at least one insulator metal oxide, wherein the at least one insulator metal oxide includes ditantalum pentaoxide;

forming a second conductive layer abutting the insulation layer, wherein the second conductive layer comprises at least one conductive metal oxide, wherein the at least one conductive metal oxide is selected from a group consisting of ruthenium oxide and iridium oxide;

forming an inhibiting layer over the second conductive layer, wherein the inhibiting layer comprises a substance selected from a group consisting of a transition metal, a transition metal alloy, a nitride compound, a noble metal, and a noble metal alloy, wherein the transition metal alloy includes a platinum rhodium alloy, wherein the transition metal is selected from a group consisting of platinum, rhodium, and tungsten, wherein the nitride compound is selected from a group consisting of tungsten nitride and titanium nitride, wherein the noble metal is selected from a group consisting of platinum, gold, titanium, and silver, and wherein the noble metal alloy is selected from a group consisting of graphite, chlorimet 3, and hastelloy C;

forming a diffusion barrier layer over the inhibiting layer and the second conductive layer; and forming a metalization layer, the metalization layer including a first portion coupled to the diffusion barrier layer, and a second portion coupled to the substrate.

12. The method of claim 11, wherein the diffusion barrier includes a conductive material.

13. The method of claim 12, wherein the diffusion barrier includes a material selected from a group consisting of a nitride compound, a carbide compound, a boride compound, a transition metal alloy, and a transition metal nitride compound alloy.

14. The method of claim 12, wherein the nitride compound includes titanium nitride.

15. The method of claim 12, wherein the transition metal alloy includes titanium tungsten.

16. The method of claim 12, wherein the transition metal nitride compound alloy includes titanium nitride tungsten.

17. A method of forming a semiconductor structure, the method comprising:

forming a first conductive layer, wherein the first conductive layer comprises at least one conductive metal oxide, wherein the at least one conductive metal oxide is selected from a group consisting of ruthenium oxide and iridium oxide;

forming an insulation layer abutting the first conductive layer, wherein the insulation layer comprises at least one insulator metal oxide, wherein the at least one insulator metal oxide includes ditantalum pentaoxide;

forming a second conductive layer abutting the insulation layer, wherein the second conductive layer comprises at least one conductive metal oxide, wherein the at least one conductive metal oxide is selected from a group consisting of ruthenium oxide and iridium oxide;

forming an inhibiting layer abutting the second conductive layer, wherein the inhibiting layer comprises a substance selected from a group consisting of a transition metal, a transition metal alloy, a nitride compound, a noble metal, and a noble metal alloy, wherein the transition metal alloy includes a platinum rhodium alloy, wherein the transition metal is selected from a group consisting of platinum, rhodium, and tungsten, and wherein the nitride compound is selected from a group consisting of tungsten nitride and titanium nitride, wherein the noble metal is selected from a group consisting of platinum, gold, titanium, and silver, and wherein the noble metal alloy is selected from a group consisting of graphite, chlorimet 3, and hastelloy C; and forming a metallization layer abutting the inhibiting layer, wherein the metallization layer comprises a representative metal, and wherein forming the metallization layer further includes forming a diffusion barrier abutting the inhibiting layer, wherein the diffusion baffler comprises a nitride compound, a carbide compound, a boride compound, a transition metal alloy, and a transition metal nitride compound alloy, wherein the nitride compound includes titanium nitride, wherein the transition metal alloy includes titanium tungsten, wherein the transition metal nitride compound alloy includes titanium nitride tungsten.

18. The method of claim 17, wherein the representative metal includes aluminum.

19. The method of claim 17, further comprising forming a silicide contact on a substrate.

20. The method of claim 17, further comprising:

forming an ohmic contact on a region of a substrate using a technique selected from a group consisting of doping the region of the substrate and forming a refractory metal silicide in the region of the substrate.

21. A method of forming a semiconductor structure, the method comprising:

forming an ohmic contact on a region of a substrate;

forming a first conductive layer, wherein the first conductive layer comprises at least one conductive metal oxide, wherein the at least one conductive metal oxide is selected from a group consisting of ruthenium oxide and iridium oxide;

forming a first insulation layer abutting the first conductive layer, wherein the first insulation layer comprises at least one insulator metal oxide, wherein the at least one insulator metal oxide includes ditantalum pentaoxide;

forming a second conductive layer abutting the first insulation layer, wherein the second conductive layer comprises at least one conductive metal oxide, wherein the at least one conductive metal oxide is selected from a group consisting of ruthenium oxide and iridium oxide;

forming an inhibiting layer abutting the second conductive layer, wherein forming the inhibiting layer includes forming the inhibiting layer that includes the execution of a vapor deposition technique, wherein the vapor deposition technique is selected from a group consisting of physical vapor deposition and chemical vapor deposition, wherein the inhibiting layer comprises a substance selected from a group consisting of a transition metal, a transition metal alloy, a nitride compound, a noble metal, and a noble metal alloy, wherein the transition metal alloy includes a platinum rhodium alloy, wherein the transition metal is selected from a group consisting of platinum, rhodium, and tungsten, wherein the nitride compound is selected from a group consisting of tungsten nitride and titanium nitride, wherein the noble metal is selected from a group consisting of platinum, gold, titanium, and silver, and wherein the noble metal alloy is selected from a group consisting of graphite, chlorimet 3, and hastelloy C;

forming a second insulation layer abutting the first conductive layer and the ohmic contact; and forming a metallization layer abutting the inhibiting layer, wherein the metallization layer comprises a representative metal, wherein the representative metal includes aluminum, and wherein forming the metallization layer includes forming a diffusion barrier abutting the inhibiting layer, wherein forming the diffusion barrier includes exposing the inhibiting layer and the ohmic contact through the second insulation layer, wherein the diffusion barrier comprises a nitride compound, a carbide compound, a boride compound, a transition metal alloy, and a transition metal nitride compound alloy, wherein the nitride compound includes titanium nitride, wherein the transition metal alloy includes titanium tungsten, wherein the transition metal nitride compound alloy includes titanium nitride tungsten.

22. The method of claim 21, wherein the inhibiting layer is formed on the second conductive layer.

* * * * *

UNITED STATES PATENT AND TRADEMARK OFFICE
CERTIFICATE OF CORRECTION

| | | |
|---|---|---|
| PATENT NO. | : 7,491,602 B2 | Page 1 of 1 |
| APPLICATION NO. | : 10/615891 | |
| DATED | : February 17, 2009 | |
| INVENTOR(S) | : Agarwal | |

It is certified that error appears in the above-identified patent and that said Letters Patent is hereby corrected as shown below:

In column 14, line 53, in Claim 17, delete "baffler" and insert -- barrier --, therefor.

Signed and Sealed this

Twenty-first Day of April, 2009

JOHN DOLL
*Acting Director of the United States Patent and Trademark Office*